United States Patent
Burak et al.

(10) Patent No.: US 9,490,770 B2
(45) Date of Patent: Nov. 8, 2016

(54) ACOUSTIC RESONATOR COMPRISING TEMPERATURE COMPENSATING LAYER AND PERIMETER DISTRIBUTED BRAGG REFLECTOR

(71) Applicant: Avago Technologies General IP (Singapore) Pte. Ltd., Singapore (SG)

(72) Inventors: Dariusz Burak, Fort Collins, CO (US); John Choy, Westminster, CO (US); Kevin J. Grannen, Thornton, CO (US); Phil Nikkel, Loveland, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 414 days.

(21) Appl. No.: 14/092,026

(22) Filed: Nov. 27, 2013

(65) Prior Publication Data

US 2014/0152152 A1 Jun. 5, 2014

Related U.S. Application Data

(63) Continuation-in-part of application No. 13/955,774, filed on Jul. 31, 2013, now Pat. No. 9,246,473, which is a continuation-in-part of application No. 13/781,491, filed on Feb. 28, 2013, which is a (Continued)

(51) Int. Cl.
*H03H 9/08* (2006.01)
*H03H 9/15* (2006.01)
*H03H 9/02* (2006.01)
*H03H 9/17* (2006.01)
*H03H 9/58* (2006.01)

(52) U.S. Cl.
CPC ......... *H03H 9/02102* (2013.01); *H03H 9/173* (2013.01); *H03H 9/175* (2013.01); *H03H 9/585* (2013.01)

(58) Field of Classification Search
USPC .......................... 310/311–371; 333/186–193
See application file for complete search history.

(56) References Cited

U.S. PATENT DOCUMENTS

| 5,587,620 A | 12/1996 | Ruby et al. |
| 5,873,153 A | 2/1999 | Ruby et al. |

(Continued)

FOREIGN PATENT DOCUMENTS

| JP | 2007-208845 A | 8/2007 |
| JP | 2008-211394 A | 9/2008 |

(Continued)

OTHER PUBLICATIONS

Ranjan et al. "Strained Hexagonal ScN: A Material with Unusual Structural and Optical Properties," Physical Review Letters, Jun. 27, 2003, vol. 90, No. 25, The American Physical Society, USA.

(Continued)

*Primary Examiner* — Thomas Dougherty

(57) ABSTRACT

An acoustic resonator structure includes a bottom electrode disposed on a substrate, a piezoelectric layer disposed on the bottom electrode, a top electrode disposed on the piezoelectric layer, a cavity disposed beneath the bottom electrode, and a temperature compensating feature. The temperature compensating feature has a positive temperature coefficient for offsetting at least a portion of a negative temperature coefficient of the piezoelectric and electrode layers. The acoustic resonator structure further includes an acoustic reflector disposed over the substrate around a perimeter of the cavity. The acoustic reflector includes a layer of low acoustic impedance material stacked on a layer of high acoustic impedance material.

20 Claims, 19 Drawing Sheets

Related U.S. Application Data continuation-in-part of application No. 13/663,449, filed on Oct. 29, 2012, said application No. 13/955,774 is a continuation-in-part of application No. 13/208,883, filed on Aug. 12, 2011, now Pat. No. 9,083,302, which is a continuation-in-part of application No. 13/074,262, filed on Mar. 29, 2011, now Pat. No. 9,136,818.

(56) References Cited

U.S. PATENT DOCUMENTS

| | | | |
|---|---|---|---|
| 6,107,721 A | 8/2000 | Lakin | |
| 6,230,378 B1* | 5/2001 | Cramer | H01L 41/083 29/25.35 |
| 6,384,697 B1 | 5/2002 | Ruby | |
| 6,424,237 B1 | 7/2002 | Ruby et al. | |
| 6,507,983 B1 | 1/2003 | Ruby et al. | |
| 6,548,943 B2 | 4/2003 | Kaitila et al. | |
| 6,936,837 B2 | 8/2005 | Yamada et al. | |
| 6,985,051 B2 | 1/2006 | Nguyen et al. | |
| 7,275,292 B2 | 10/2007 | Ruby et al. | |
| 7,280,007 B2 | 10/2007 | Feng et al. | |
| 7,345,410 B2 | 3/2008 | Grannen et al. | |
| 7,358,831 B2 | 4/2008 | Larson, III et al. | |
| 7,388,454 B2 | 6/2008 | Ruby et al. | |
| 7,466,213 B2 | 12/2008 | Lobl et al. | |
| 7,468,608 B2 | 12/2008 | Feucht et al. | |
| 7,616,079 B2 | 11/2009 | Tikka et al. | |
| 7,629,865 B2 | 12/2009 | Ruby | |
| 7,636,026 B2 | 12/2009 | Heinze et al. | |
| 7,758,979 B2 | 7/2010 | Akiyama et al. | |
| 7,889,024 B2 | 2/2011 | Bradley et al. | |
| 7,966,722 B2 | 6/2011 | Hart et al. | |
| 8,008,993 B2 | 8/2011 | Milsom et al. | |
| 8,030,823 B2 | 10/2011 | Sinha et al. | |
| 8,222,795 B2 | 7/2012 | Sinha et al. | |
| 8,253,513 B2 | 8/2012 | Zhang | |
| 8,384,497 B2 | 2/2013 | Zhang | |
| 9,083,302 B2* | 7/2015 | Burak | H03H 9/132 |
| 2002/0038989 A1* | 4/2002 | Larson, III | H03H 3/04 310/330 |
| 2002/0153965 A1 | 10/2002 | Ruby et al. | |
| 2003/0227357 A1 | 12/2003 | Metzger et al. | |
| 2004/0140868 A1* | 7/2004 | Takeuchi | H03H 9/0095 333/189 |
| 2005/0151600 A1* | 7/2005 | Takeuchi | H03H 9/0095 333/191 |
| 2005/0206479 A1 | 9/2005 | Nguyen et al. | |
| 2007/0205850 A1 | 9/2007 | Jamneala et al. | |
| 2008/0129414 A1 | 6/2008 | Lobl et al. | |
| 2008/0258842 A1 | 10/2008 | Ruby et al. | |
| 2009/0102319 A1 | 4/2009 | Nakatsuka et al. | |
| 2010/0091370 A1 | 4/2010 | Mahrt et al. | |
| 2010/0107389 A1 | 5/2010 | Nessler et al. | |
| 2010/0327697 A1 | 12/2010 | Choy et al. | |
| 2010/0327994 A1 | 12/2010 | Choy et al. | |
| 2011/0121916 A1 | 5/2011 | Barber et al. | |
| 2011/0204996 A1 | 8/2011 | Gilbert et al. | |
| 2011/0227671 A1* | 9/2011 | Zhang | H04R 17/00 333/195 |
| 2012/0177816 A1 | 7/2012 | Larson et al. | |
| 2012/0218055 A1 | 8/2012 | Burak et al. | |
| 2012/0218059 A1 | 8/2012 | Burak et al. | |
| 2012/0218060 A1 | 8/2012 | Burak et al. | |
| 2012/0280767 A1 | 11/2012 | Burak et al. | |
| 2013/0082799 A1 | 4/2013 | Zuo et al. | |
| 2013/0106534 A1 | 5/2013 | Burak et al. | |
| 2013/0127300 A1 | 5/2013 | Umeda et al. | |
| 2013/0314177 A1 | 11/2013 | Burak et al. | |
| 2014/0111288 A1 | 4/2014 | Nikkel et al. | |
| 2014/0118088 A1 | 5/2014 | Burak et al. | |
| 2014/0118091 A1 | 5/2014 | Burak et al. | |
| 2014/0118092 A1 | 5/2014 | Burak et al. | |
| 2014/0225683 A1* | 8/2014 | Burak | H03H 9/173 333/187 |

FOREIGN PATENT DOCUMENTS

| | | | | |
|---|---|---|---|---|
| JP | 2008-211394 A | * | 9/2008 | H03H 9/54 |
| WO | 2006079353 | | 8/2006 | |
| WO | 2013065488 | | 5/2013 | |

OTHER PUBLICATIONS

Farrer et al., "Properties of hexagonal ScN versus wurtzite GaN and InN," Physical Review B, Nov. 20, 2002, vol. 66, No. 20, The American Physical Society, USA.

Constantin et al., "Composition-dependent structural properties in ScGaN alloy films: A combined experimental and theoretical study," Journal of Applied Physics, Dec. 16, 2005, vol. 98, No. 12, American Institute of Physics, USA.

Akiyama et al., "Enhancement of piezoelectric response in scandium aluminum nitride alloy thin films prepared by dual reactive cosputtering," Advanced Materials, 2009, vol. 21, pp. 593-596, Japan.

Suzuki et al., "Influence of shadowing effect on shear mode acoustic properties in the c-axis tilted AlN films," IEEE Ultrasonics Symposium (IUS), 2010, pp. 1478-1481.

Yanagitani et al., "Giant shear mode electromechanical coupling coefficient k12 in c-axis tilted ScAlN films," IEEE Ultrasonics Symposium (IUS), 2010.

Kano, et al., "Enhancement of Piezoelectric Response in Scandium Aluminum Nitride Alloy Thin Films Prepared by Dual Reactive Co-Sputtering", vol. 17, 2012.

Moriera, et al., "Aluminum Scandium Nitride Thin-Film Bulk Acoustic Resonators for Wide Band Applications", Vacuum 86 (2011) 23-26.

Pandey, et al., "Anchor Loss Reduction in Resonant MEMS using MESA Structures", *Proceedings of the 2nd IEEE International Conference on Nano/Micro Engineered and Molecular Systems*, Bangkok, Thailand Jan. 16-19, 2007, 880-885.

Tas, et al., "Reducing Anchor Loss in Micromechanical Extensional Mode Resonators", *IEEE Transactions on Ultrasonics, Ferroelectrics and Frequency Control*, vol. 57, No. 2. Feb. 2010, 448-454.

"IEEE Xplore Abstract for Suppression of Acoustic Energy Leakage in FBARS with Al Bottom Electrode: FEM Simulation and Experimental Results", Oct. 28-31, 2007, 2 pages.

"Machine Translation of JP 2007-208845", Aug. 16, 2007, 1-9.

"Machine Translation of JP 2008-211394", Sep. 11, 2008, 1-8.

Ohara, et al., "Suppression of Acoustic Energy Leakage in FBARs with Al Bottom Electrode: FEM Simulation and Experimental Results", 2007 IEEE Ultrasonics Symposium, Oct. 28-31, 2007, 1657-1660.

Tang, et al. "Micromachined Bulk Acoustic Resonator with a Raised Frame", 16th International Conference on Mechatronics Technology, Oct. 16-19, 2012, Tianjin, China.

Pensala, "Thin Film Bulk Acoustic Wave Devices", Dissertation, VTT Publications 756.

Co-pending U.S. Appl. No. 13/658,024, filed Oct. 23, 2012.
Co-pending U.S. Appl. No. 13/663,449, filed Oct. 29, 2012.
Co-pending U.S. Appl. No. 13/660,941, filed Oct. 25, 2012.
Co-pending U.S. Appl. No. 13/654,718, filed Oct. 18, 2012.
Co-pending U.S. Appl. No. 13/781,491, filed Feb. 28, 2013.

Robert Aigner, "SAW, BAW and the future of wireless", May 6, 2013, pp. 1-4.

M. El Hassan et al., "Techniques for Tuning BAW-SMR Resonators for the 4th Generation of Mobile Communications", Intech, 2013, pp. 421-442.

Co-pending U.S. Appl. No. 13/766,993, filed Feb. 14, 2013.
Co-pending U.S. Appl. No. 13/955,774, filed Jul. 31, 2013.
Co-pending U.S. Appl. No. 13/662,460, filed Oct. 27, 2012.
Co-pending U.S. Appl. No. 13/662,425, filed Oct. 27, 2012.

* cited by examiner

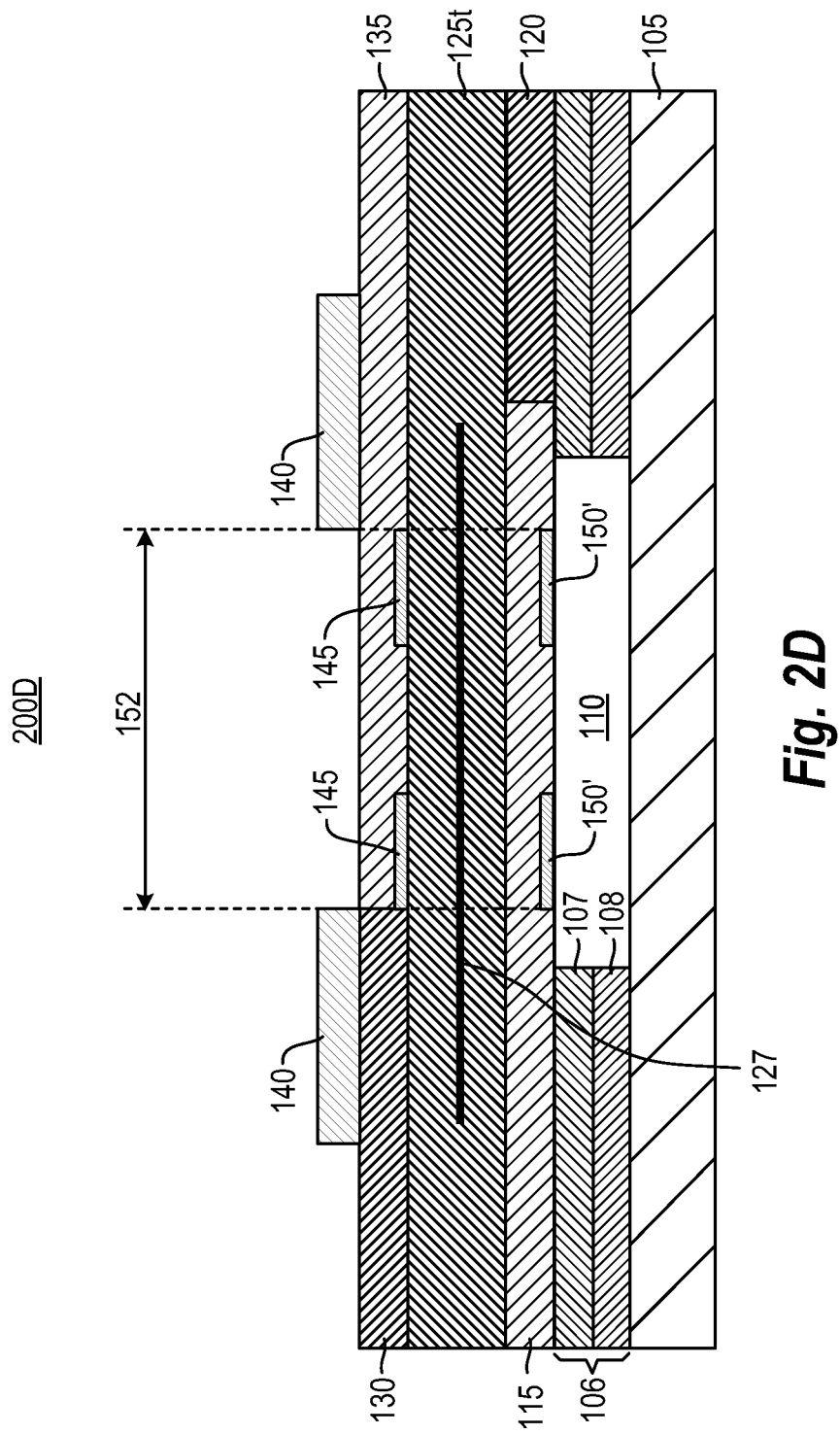

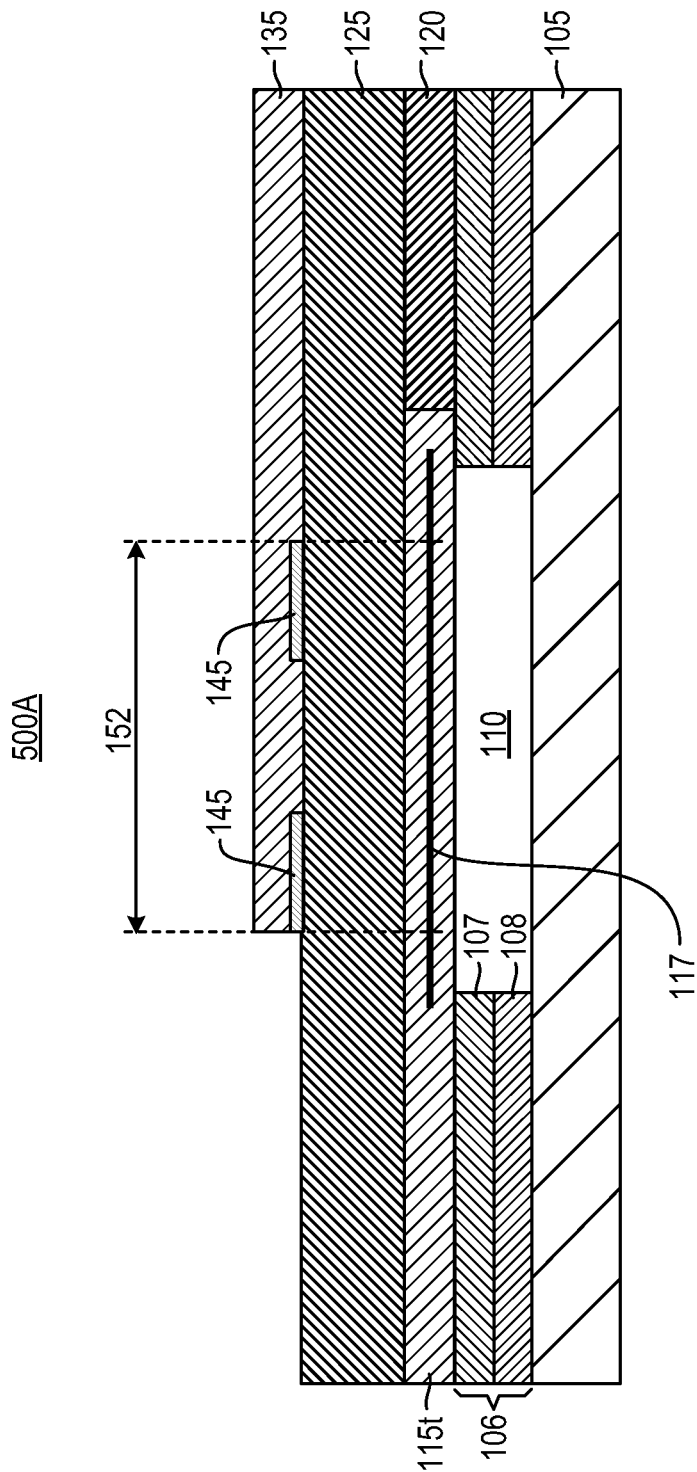

ACOUSTIC RESONATOR COMPRISING TEMPERATURE COMPENSATING LAYER AND PERIMETER DISTRIBUTED BRAGG REFLECTOR

CROSS REFERENCE TO RELATED APPLICATIONS

This application is a continuation-in-part under 37 C.F.R. §1.53(b) of commonly owned U.S. patent application Ser. No. 13/955,774 entitled "Acoustic Resonator Comprising Collar, Frame and Perimeter Distributed Bragg Reflector," filed on Jul. 31, 2013, which is a continuation-in-part of commonly owned U.S. patent application Ser. No. 13/781, 491 entitled "Acoustic Resonator Having Collar and Frame," filed on Feb. 28, 2013, which is a continuation-in-part of commonly owned U.S. patent application Ser. No. 13/663,449 entitled "Acoustic Resonator Having Collar Structure," filed on Oct. 29, 2012, which are hereby incorporated by reference in their entireties. U.S. patent application Ser. No. 13/955,774 is also a continuation-in-part under 37 C.F.R. §1.53(b) of commonly owned U.S. patent application Ser. No. 13/208,883 entitled "Stacked Bulk Acoustic Resonator Comprising a Bridge and an Acoustic Reflector along a Perimeter of the Resonator," filed on Aug. 12, 2011 (published as U.S. Patent App. Pub. No. 2012/0218059), which is a continuation-in-part application of commonly owned U.S. patent application Ser. No. 13/074,262 entitled "Stacked Acoustic Resonator Comprising Bridge" filed on Mar. 29, 2011 (published as U.S. Patent App. Pub. No. 2012/0218055), which are hereby incorporated by reference in their entireties.

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators such as thin film bulk acoustic resonators (FBARs), coupled resonator filters (CRFs), stacked bulk acoustic resonators (SBARs), double bulk acoustic resonators (DBARs), and solidly mounted resonators (SMRs). An FBAR, for example, includes a piezoelectric layer between a first (bottom) electrode and a second (top) electrode over a cavity. BAW resonators may be used in a wide variety of electronic applications, such as cellular telephones, personal digital assistants (PDAs), electronic gaming devices, laptop computers and other portable communications devices. For example, FBARs may be used for electrical filters and voltage transformers.

An acoustic resonator typically comprises a layer of piezoelectric material sandwiched between two plate electrodes in a structure referred to as an acoustic stack. Where an input electrical signal is applied between the electrodes, reciprocal or inverse piezoelectric effect causes the acoustic stack to mechanically expand or contract depending on the polarization of the piezoelectric material. As the input electrical signal varies over time, expansion and contraction of the acoustic stack produces acoustic waves that propagate through the acoustic resonator in various directions and are converted into an output electrical signal by the piezoelectric effect. Some of the acoustic waves achieve resonance across the acoustic stack, with the resonant frequency being determined by factors such as the materials, dimensions, and operating conditions of the acoustic stack. These and other mechanical characteristics of the acoustic resonator determine its frequency response.

In general, an acoustic resonator comprises different lateral regions that may be subject to different types of resonances, or resonance modes. These lateral regions can be characterized, very broadly, as a main membrane region and peripheral regions, where the main membrane region is defined, roughly, by an overlap between the two plate electrodes and the piezoelectric material, and the peripheral regions are defined as areas outside the main membrane region. Two peripheral regions, in particular, are defined as a region located between the edge of the main membrane region and edge of the air-cavity, and a region of an overlap of at least one plate electrode and the piezoelectric material with the substrate. The main membrane region is subject to electrically excited modes generated by the electric field between the two plate electrodes, and both the main membrane and the peripheral regions are subject to certain derivative modes generated by scattering of energy in the electrically excited modes. The electrically excited modes comprise, for instance, a piston mode formed by longitudinal acoustic waves with boundaries at the edges of the main membrane region. The derivative modes comprise, for instance, lateral modes formed by lateral acoustic waves excited at the edges of the main membrane region and the peripheral regions.

The lateral modes facilitate continuity of appropriate mechanical particle velocities and stresses between the electrically driven main membrane region and the essentially non-driven peripheral regions. They can either propagate freely (so called propagating modes) or exponentially decay (so called evanescent and complex modes) from the point of excitation. They can be excited both by lateral structural discontinuities (e.g., an interface between regions of different thicknesses in the main membrane region, or an edge of a top or bottom electrode) or by electric field discontinuities (e.g., an edge of a top electrode where the electric field is terminated abruptly).

The lateral modes generally have a deleterious impact on the performance of an acoustic resonator. Accordingly, some acoustic resonators include ancillary structural features designed to suppress, inhibit, or mitigate the lateral modes. For example, a collar may be formed by a dielectric material outside the boundary of the main membrane region to allow a smooth decay of evanescent modes emanating from the boundary and improve confinement of mechanical motion to the main membrane region. In another example, a frame may be formed by a conductive or dielectric material within the boundary of the main membrane region to minimize scattering of electrically excited piston mode at top electrode edges and improve confinement of mechanical motion to the main membrane region.

The conventional implementation of these ancillary structural features has a number of potential shortcomings. For instance, depending on their specific design, they may be a source of additional scattering of the piston mode which may outweigh their benefits. Additionally, they may require the presence of certain additional materials that can deleteriously redistribute the acoustic energy in the acoustic stack, such as relatively soft planarization layers. Also, some design choices may produce only modest performance improvements while significantly driving up cost. Moreover, the formation of ancillary structural features may degrade structural stability or interfere with the formation of overlying layers.

In addition, conventional FBARs rely on strong confinement of electrically excited piston mode. Strong confinement is provided by the edges of the top and bottom electrodes, as well as ancillary structural features, such as air-bridges and conventional outside frames. While the apparent advantage of strong confinement is that it prevents strong electrical excitation of mechanical motion at the edge of the top electrode, it also provides significant acoustic discontinuities, leading to scattering of energy out of the desired piston mode into undesired extensional, shear, flexural and dilatational modes of the whole structure. Accordingly, in view of these and other shortcomings of conventional acoustic resonator structures, there is a general need for improved acoustic resonator designs.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 2D is a cross-sectional view of an acoustic resonator according to another representative embodiment.

FIG. 5A is a cross-sectional view of an acoustic resonator, excluding frames, according to another representative embodiment.

DETAILED DESCRIPTION

Figure 1A:
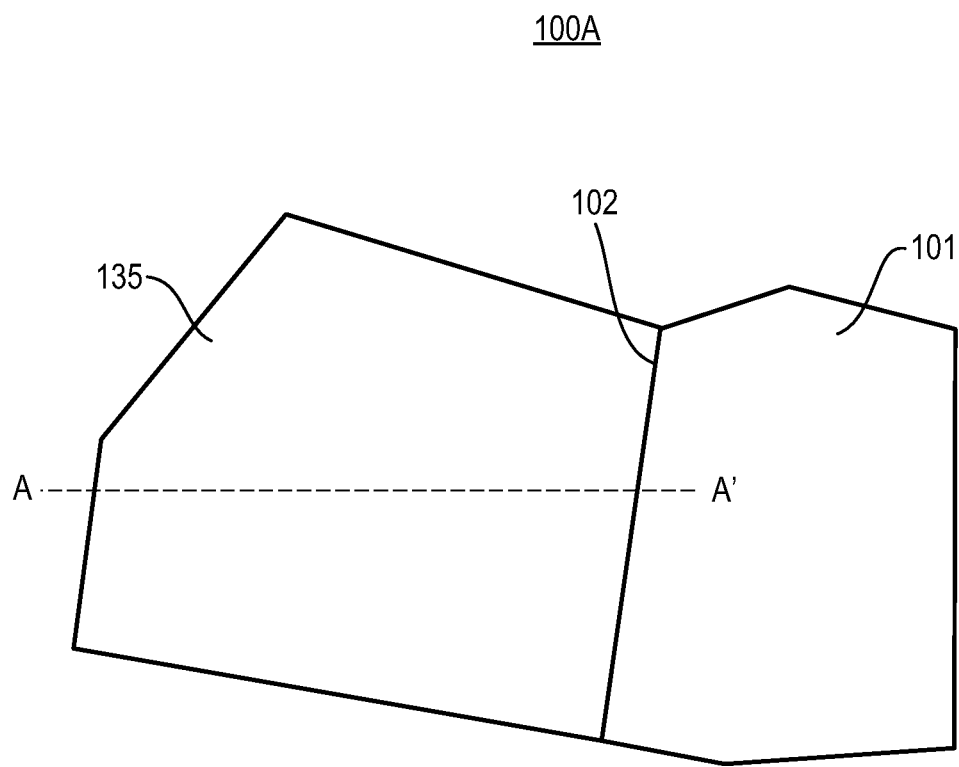
FIG. 1A is a top view of an acoustic resonator according to a representative embodiment.

In the following detailed description, for purposes of explanation and not limitation, example embodiments disclosing specific details are set forth in order to provide a thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

The present teachings relate generally to acoustic resonators such as film bulk acoustic wave resonators (FBARs) or solidly mounted resonators (SMRs), although the discussion is directed to FBARs for the sake of convenience. Certain details of acoustic resonators, including materials and methods of fabrication, may be found in one or more of the following commonly owned U.S. Patents and Patent Applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. Patent App. Pub. No. 2010/0327697 to Choy et al.; U.S. Patent App. Pub. No. 2010/0327994 to Choy et al., U.S. patent application Ser. No. 13/658,024 to Nikkel et al.; U.S. patent application Ser. No. 13/663,449 to Burak et al.; U.S. patent application Ser. No. 13/660,941 to Burak et al.; U.S. patent application Ser. No. 13/654,718 to Burak et al.; U.S. Patent App. Pub. No. 2008/0258842 to Ruby et al.; and U.S.

Pat. No. 6,548,943 to Kaitila et al. The disclosures of these patents and patent applications are hereby specifically incorporated by reference in their entireties. It is emphasized that the components, materials and method of fabrication described in these patents and patent applications are representative and other methods of fabrication and materials within the purview of one of ordinary skill in the art are contemplated.

In certain embodiments described below, an acoustic resonator comprises a piezoelectric layer disposed between top and bottom electrodes, a temperature compensating feature disposed in or between the bottom electrode, the piezoelectric layer and/or the top electrode, and an acoustic reflector, such as a distributed Bragg reflector (DBR), provided around a perimeter of a cavity defined by the acoustic reflector and/or the substrate. The perimeter DBR may be formed of a single layer or multiple layers. For example, the DBR may be formed of one or more pairs of layers formed under a bottom electrode where it minimizes a detrimental impact of a so-called "dead-FBAR" region in which acoustic vibrations of the acoustic resonator may be attenuated through mechanical scattering of the electrically excited motion at a boundary between the bottom electrode and an underlying substrate and through the transducer effect in the region where FBAR acoustic stack overlaps the substrate. Each pair of layers consists of a low acoustic impedance layer stacked on a high acoustic impedance layer.

The acoustic resonator may further include a collar disposed outside a main membrane region and/or a frame disposed within the main membrane region. The collar typically has an inner edge substantially aligned with a boundary of the main membrane region or somewhat overlapping the main membrane region, and the frame typically has an outer edge substantially aligned with the boundary of the main membrane region. The cavity may be disposed within the main membrane region.

Figure 1B:
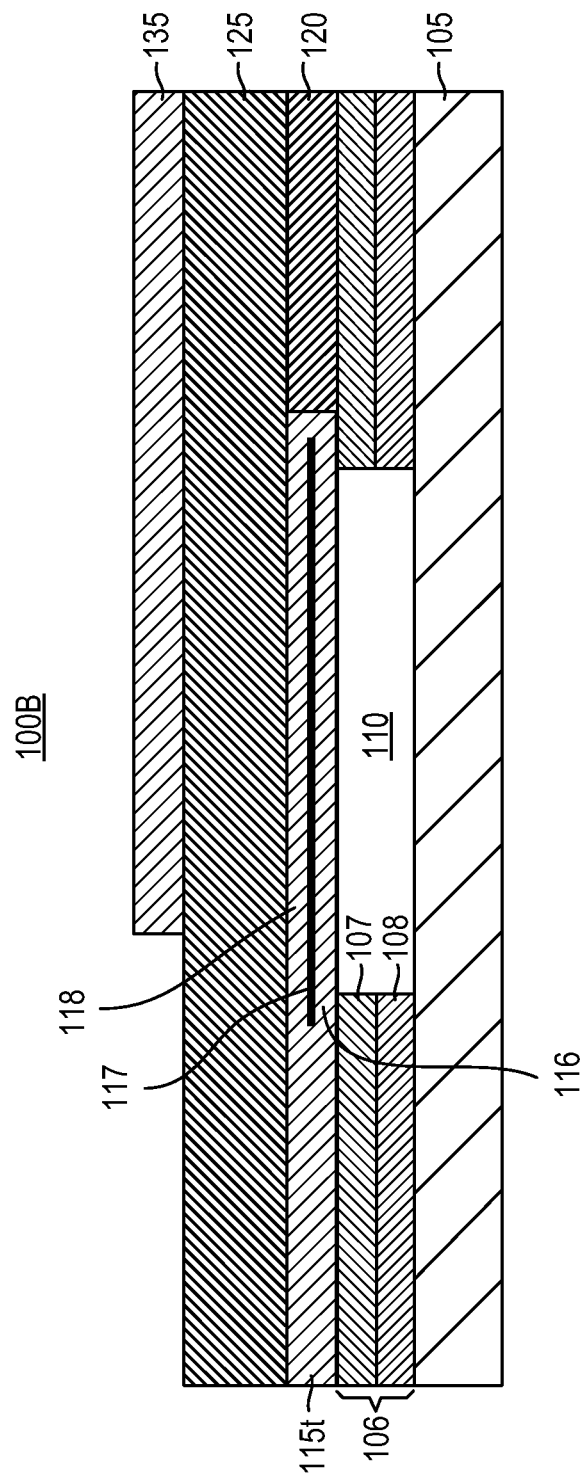
FIG. 1B is a cross-sectional view of an acoustic resonator according to a representative embodiment.
Figure 1C:
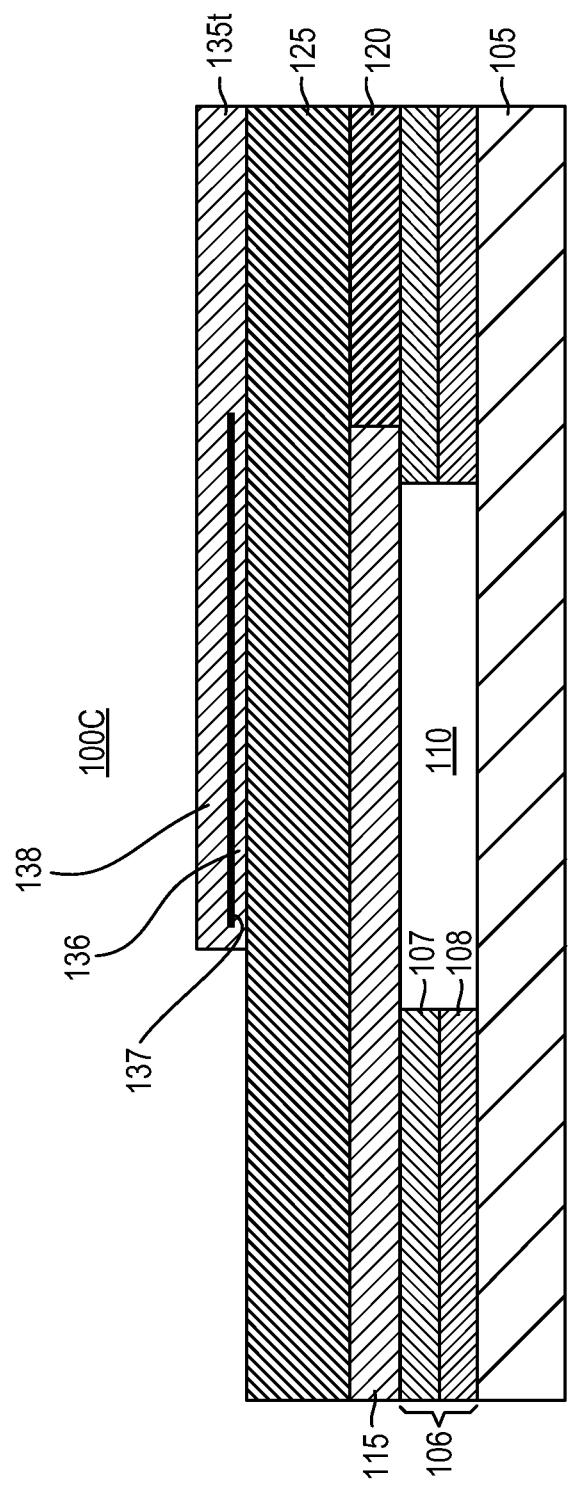
FIG. 1C is a cross-sectional view of an acoustic resonator according to another representative embodiment.
Figure 1D:
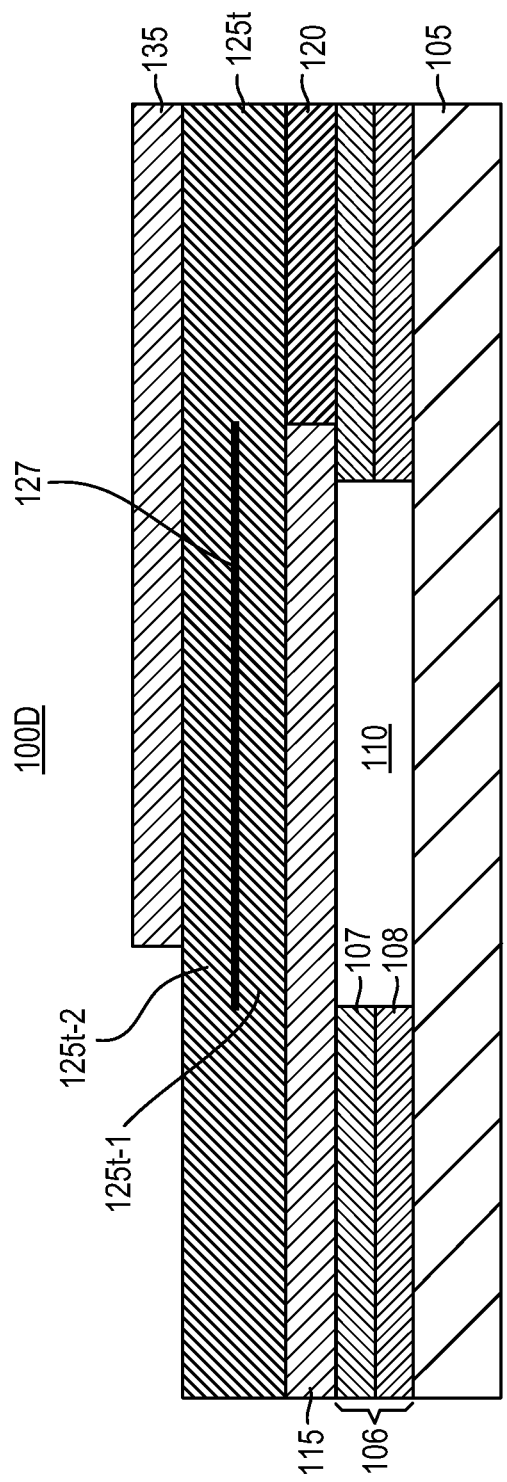
FIG. 1D is a cross-sectional view of an acoustic resonator according to another representative embodiment.

FIG. 1A is a top view of an acoustic resonator 100A according to a representative embodiment, and FIGS. 1B-1D are cross-sectional views of acoustic resonator 100A, taken along a line A-A' according to different embodiments. The cross-sectional views correspond to different variations of acoustic resonator 100A and will be referred to, respectively, as acoustic resonators 100B-100D. Acoustic resonators 100B-100D have many of the same features, so a repetitive description of these features may be omitted in an effort to avoid redundancy.

Referring to FIG. 1A, acoustic resonator 100A comprises a top electrode 135 having five (5) sides, with a connection side 101 configured to provide an electrical connection to interconnect 102. Interconnect 102 provides electrical signals to top electrode 135 to excite desired acoustic waves in a piezoelectric layer (not shown in FIG. 1A) of acoustic resonator 100A.

FIGS. 1B-1D are cross-sectional diagrams illustrating acoustic resonators, according to representative embodiments. In the examples depicted in FIGS. 1B-1D (as well as the examples depicted in FIGS. 2A through 6, discussed below), the acoustic resonator is an FBAR, for convenience of explanation. However, it is understood that other types of acoustic resonators may be included, without departing from the scope of the present teachings. Each of the acoustic resonators shown in FIGS. 1B-1D includes an acoustic reflector or acoustic mirror, such as a distributed Bragg reflector (DBR) surrounding a perimeter of a cavity formed beneath the acoustic stack, as well as a temperature compensating feature (e.g., temperature compensating layer) located in or on an electrode or a piezoelectric layer of the acoustic stack. It is understood that the same general configurations may be included in acoustic resonators having frames and/or collars in various locations, without departing from the scope of the present teachings.

Referring to FIG. 1B, acoustic resonator 100B, which may be an FBAR, for example, comprises a substrate 105, a cavity 110 (e.g., air cavity) and a perimeter acoustic reflector, indicated by perimeter distributed Bragg reflector (DBR) 106 formed around a perimeter of the cavity 110. The perimeter DBR 106 includes one or more pairs of acoustic impedance layers, indicated by representative first acoustic impedance layer 107 and second acoustic impedance layer 108, discussed below. In the depicted embodiment, the perimeter DBR 106 is formed over a top surface of the substrate 105, and the cavity 110 is defined by the perimeter DBR 106. Although shown as extending through both the first and second acoustic impedance layers 107 and 108 of the perimeter DBR 106, the cavity 110 is not limited to this configuration. For example, the cavity 110 may alternatively extend only partially through the first acoustic impedance layer 107 or entirely through the first acoustic impedance layer 107 and only partially through the second acoustic impedance layer 108, without departing from the scope of the present teachings. Also, in alternative embodiments, the cavity 110 may extend entirely through the perimeter DBR 106, and be defined partially within the substrate 105 as well. A bottom electrode 115t is disposed on the perimeter DBR 106 over the substrate 105 and the cavity 110, and a first planarization layer 120 is disposed on the perimeter DBR 106 adjacent to the bottom electrode 115. A piezoelectric layer 125 is disposed on the bottom electrode 115t and the first planarization layer 120. A top electrode 135 is disposed on the piezoelectric layer 125. A second planarization layer (not shown) may be disposed on the piezoelectric layer 125 adjacent to the top electrode 135, depending of placement of a collar, if any, as discussed below. Collectively, the bottom electrode 115t, the piezoelectric layer 125, and the top electrode 135 constitute an acoustic stack of acoustic resonator 100B.

Generally, the perimeter DBR 106 substantially eliminates "dead-FBAR" by providing acoustic isolation of a connecting edge of the top electrode 135 from the substrate 105. The perimeter DBR 106 also prevents evanescent and complex modes of the region outside of the top electrode 135 (between the top electrode edge and the substrate edge) from coupling to the substrate 105, as evanescent and complex modes decay exponentially from the excitation edge located at the edge of the top electrode 135.

The acoustic resonator 100B further includes a temperature compensating feature, indicated as a temperature compensating layer 117 in the bottom electrode 115t, which stabilizes changes of the sound velocity and the cut-off frequency of the piezoelectric layer 125 in response to changes in temperature. More particularly, the bottom electrode 115t includes outside electrode layer 116, temperature compensating layer 117 and conductive interposer layer 118 stacked in this order on the perimeter DBR 106 and/or the substrate 105. The interposer layer 118 separates the temperature compensating layer 117 from the piezoelectric layer 125, so that the temperature compensating layer 117 is effectively buried or encapsulated within the bottom electrode 115t. In other words, the temperature compensating layer 117 is not formed on a top or bottom surface of the bottom electrode 115t and is therefore separated from adjacent components (e.g., piezoelectric layer 125 and substrate 105) in the acoustic stack.

The presence of the interposer layer 118 is not necessary, although it facilitates proper growth of the piezoelectric layer 125 and otherwise provides protection of the temperature compensating layer 117 (e.g., from hydrofluoric acid (HF) used for wet etching or wet release process) during the fabrication process. Also, the presence and thickness of the interposer layer 118 affect temperature compensation effects of the temperature compensating layer 117. In addition, a thick enough interposer layer 118 made of low sheet resistance metal, for example, may electrically short the temperature compensating layer 117, therefore eliminating its series capacitance and possibly increasing electromechanical coupling coefficient $Kt^2$. On the other hand, a relatively thick interposer layer 118 may acoustically imbalance the stack by forming a low acoustic energy density region (the interposer layer 118) separating two high acoustic energy density regions (the temperature compensating layer 117 and the piezoelectric layer 125) which in turn may cause increased loss to acoustic radiation mechanism and decreased quality factor-Q and parallel resistance Rp. Various illustrative temperature compensating layers and fabrication techniques are described by U.S. patent application Ser. No. 13/766,993 (filed Feb. 14, 2013), to Burak et al., which is hereby incorporated by reference in its entirety.

Of course, the relative thicknesses of the outside electrode layer 116 and interposer layer 118 and/or the temperature compensating layer 117 may be varied, without departing from the scope of the present teachings. For example, the thickness of the interposer layer 118 may be increased, thus "sinking" the temperature compensating layer 117 deeper into the bottom electrode 115t (and further away from the active piezoelectric layer 125). Generally, the thickness and location of the temperature compensating layer 117, as well as the thicknesses of the outside electrode layer 116 and the interposer layer 118, within the bottom electrode 115t should be optimized in order to maximize the coupling coefficient for an allowable linear temperature coefficient. This optimization may be accomplished, for example, by modeling an equivalent circuit of the acoustic stack using a Mason model, as would be apparent to one of ordinary skill in the art. Although there is some degradation in the offsetting effects of the temperature coefficient by sinking the temperature compensating layer 117, the coupling coefficient of the acoustic resonator 100B may be improved. An algorithm may be developed to optimize the depth of the temperature compensating layer 117 in the bottom electrode 115t in light of the trade-off between the temperature coefficient and the coupling coefficient, for example, using a multivariate optimization technique, such as a Simplex method, as would be apparent to one of ordinary skill in the art. In addition, the depth of the temperature compensating layer 117 may be limited by various constraints, such as minimum necessary coupling coefficient and maximum allowable temperature coefficient. Likewise, the thickness of the temperature compensating layer 117 may be adjusted to provide the optimal coupling coefficient and a minimum overall temperature coefficient of the acoustic resonator 100B. Such optimization and corresponding considerations regarding temperature compensating layers are also applicable to the other FBARs discussed herein (e.g., acoustic resonators 100C and 100D, discussed below).

As shown in FIG. 1B, the encapsulated temperature compensating layer 117 is surrounded by the outside electrode layer 116 and the interposer layer 118. An example of encapsulating the temperature compensating layer 117 is described in more detail by U.S. patent application Ser. No. 13/766,993 (filed Feb. 14, 2013), to Burak et al., which is hereby incorporated by reference in its entirety. However, in alternative embodiments, the temperature compensating layer 117 may not be encapsulated, or may be partially encapsulated, such that at least a portion of the temperature compensating layer 117 is exposed at one or more edges (top, bottom or side) of the bottom electrode 115t. For example, the temperature compensating layer 117 may extend the entire width (horizontal direction in the depicted orientation) of the bottom electrode 115t. Also, for example, a surface of the temperature compensating layer 117 may abut a surface of the piezoelectric layer 125, that is, when the interposer layer 118 is not present.

In the bottom electrode 115t, the outside electrode layer 116 and the interposer layer 118 may be formed of electrically conductive materials, such as various metals compatible with semiconductor processes, including tungsten (W), molybdenum (Mo), aluminum (Al), platinum (Pt), ruthenium (Ru), niobium (Nb), or hafnium (Hf), for example. In the depicted embodiment, the outside electrode layer 116 and the interposer layer are formed of the same conductive material (e.g., Mo). However, in various alternative embodiments, the outside electrode layer 116 and the interposer layer 118 may be formed of different conductive materials, where the outside electrode layer 116 is formed of a material having relatively lower conductivity and relatively higher acoustic impedance, and the interposer layer 118 is formed of a material having relatively higher conductivity and relatively lower acoustic impedance. For example, the outside electrode layer 116 may be formed of W and the interposer layer 118 may be formed of Mo, although other materials and/or combinations of materials may be used without departing from the scope of the present teachings.

The temperature compensating layer 117 may be formed of various materials compatible with semiconductor processes, including boron silicate glass (BSG), silicon dioxide (SiO2), chromium (Cr) or tellurium oxide (TeO(x)), for example, which have positive temperature coefficients. The positive temperature coefficient of the temperature compensating layer 117 offsets negative temperature coefficients of other materials in the acoustic stack, including the piezoelectric layer 125, the top electrode 135, and the outside electrode and interposer layers 116 and 118 of the bottom electrode 115t.

In the depicted embodiment, the perimeter DBR 106 comprises a single pair of acoustic impedance layers, first acoustic impedance layer 107 and second acoustic impedance layer 108. The first acoustic impedance layer 107 is formed of a material having relatively low acoustic impedance, which may be a relatively soft material, such as silicon oxide ($SiO_x$) or silicon nitride ($SiN_x$), where x is an integer, carbon-doped silicon oxide (CDO), chemical vapor deposition silicon carbide (CVD SiC), or plasma enhanced CVD SiC (PECVD SiC). The second acoustic impedance layer 108 is formed of a material having relatively high acoustic impedance, which may be a relatively hard material, such as tungsten (W) or molybdenum (Mo), for example. The first and second acoustic impedance layers 107 and 108 may be formed with respective thicknesses corresponding to a quarter wavelength of a natural resonance frequency of acoustic resonator 100B.

In various embodiments, the perimeter DBR may include other numbers of acoustic impedance layers and/or acoustic impedance layer pairs, without departing from the scope of the present teachings. For example, the perimeter DBR may be formed of a single quarter-wavelength layer (e.g., having relatively low acoustic impedance), or of multiple pairs of acoustic impedance layers. When there are additional acoustic impedance layer pairs in the perimeter DBR, each pair likewise includes a first acoustic impedance layer formed of low acoustic impedance material stacked on a second acoustic impedance layer formed of high acoustic impedance material. Various illustrative fabrication techniques of acoustic mirrors are described by in U.S. Pat. No. 7,358,831 (Apr. 15, 2008), to Larson III, et al., which is hereby incorporated by reference in its entirety.

Notably, FIG. 1B depicts a single acoustic resonator 100B. If the acoustic resonator 100B were to be included in a device with additional acoustic resonators, for example, in a filter including 5-10 acoustic resonators, the first and second acoustic impedance layers 107 and 108 of the perimeter DBR 106 would need to be electrically isolated from perimeter DBRs of the other acoustic resonators, as would be apparent to one of ordinary skill in the art. For example, a trench or other isolating means may be etched off around the perimeter DBR 106 down to the substrate 105.

The amount of acoustic isolation provided by perimeter DBR 106 generally depends on the contrast between the acoustic impedances of adjacent acoustic impedance layers, with a greater amount of contrast creating better acoustic isolation. In some embodiments, the perimeter DBR 106 is formed in pairs of dielectric materials having contrasting acoustic impedances. For example, the first acoustic impedance layer 107 (along with any additional odd acoustic impedance layers) may be formed of silicon oxide ($SiO_x$), where x is an integer, while the second acoustic impedance layer 108 (along with any additional even acoustic impedance layers) paired with the first acoustic impedance layer 107 may be formed of tungsten (W) or molybdenum (Mo). In another example, the first acoustic impedance layer 107 (along with any additional odd acoustic impedance layers) may be formed of carbon-doped silicon oxide (CDO), while the second acoustic impedance layer 108 (along with any additional even acoustic impedance layers) paired with the first acoustic impedance layer 107 may be formed of silicon nitride ($SiN_x$), where x is an integer. A benefit of this pairing of materials is that the layer may be grown in a single machine by depositing CDO onto a silicon wafer, for example, within a first chamber, moving the wafer to a second chamber, depositing silicon nitride on the wafer in the second chamber, moving the wafer back into the first chamber, and so on. Of course, the low and high acoustic impedance materials forming the stacked layers of the perimeter DBR 106 may vary without departing from the scope of the present teachings.

The substrate 105 may be formed of a material compatible with semiconductor processes, such as silicon (Si), gallium arsenide (GaAs), indium phosphide (InP), glass, sapphire, alumina, or the like, for example. Various illustrative fabrication techniques for an air cavity in a substrate are described by U.S. Pat. No. 7,345,410 (Mar. 18, 2008), to Grannen et al., which is hereby incorporated by reference in its entirety. The piezoelectric layer 125 may be formed of any piezoelectric material compatible with semiconductor processes, such as aluminum nitride (AlN), zinc oxide (ZnO), or zirconate titanate (PZT), for example.

The first planarization layer 120 may be formed of borosilicate glass (BSG), for example. The first planarization layer 120 is not strictly required for the functioning of acoustic resonator 100B, but its presence can confer various benefits. For instance, the presence of first planarization layer 120 tends to improve the structural stability of acoustic resonator 100B, may improve the quality of growth of subsequent layers, and may allow bottom electrode 115t to be formed without its edges extending beyond the cavity 110. Further examples of potential benefits of planarization are presented in U.S. Patent App. Pub. No. 2013/0106534 to Burak et al., which is hereby incorporated by reference in its entirety. The bottom and top electrodes 115t and 135 may be formed of one or more electrically conductive metal materials, such as tungsten (W), molybdenum (Mo), copper (Cu) or aluminum (Al). The bottom and top electrodes 115t and 135 electrodes may be formed of the same or different materials.

Of course, other materials may be incorporated into the above and other features of acoustic resonator 100B without departing from the scope of the present teachings.

Referring to FIG. 1C, the acoustic resonator 100C is similar to the acoustic resonator 100B, except for placement of the temperature compensating feature, which is depicted as temperature compensating layer 137 in top electrode 135t. That is, the acoustic resonator 100C includes substrate 105, cavity 110 and perimeter DBR 106 around a perimeter of the cavity 110. Bottom electrode 115 is disposed on the perimeter DBR 106 over the substrate 105 and the cavity 110, and first planarization layer 120 is disposed on the perimeter DBR 106 adjacent to the bottom electrode 115. Piezoelectric layer 125 is disposed on the bottom electrode 115 and the first planarization layer 120, and the top electrode 135t, including the temperature compensating layer 137, is disposed on the piezoelectric layer 125. The perimeter DBR 106 includes first and second acoustic impedance layers 107 and 108, where the first acoustic impedance layer 107 is formed of a material having relatively low acoustic impedance and the second acoustic impedance layer 108 is formed of a material having relatively high acoustic impedance, although additional acoustic impedance layers may be included.

More particularly, the top electrode 135t includes conductive interposer layer 136, temperature compensating layer 137 and outside electrode layer 138, stacked in this order on the piezoelectric layer 125. The interposer layer 136 separates the temperature compensating layer 137 from the piezoelectric layer 125. Although the presence of an interposer layer 136 is not necessary, particularly since it is not required to assist growth of the piezoelectric layer 125, it provides protection of the temperature compensating layer 137 (e.g., from HF used for wet etching) during the fabrication process, and otherwise influences the temperature compensation effects of the temperature compensating layer 137. In alternative embodiments, the interposer layer 136 is not included, and thus the temperature compensating layer 137 is formed directly on the top surface of the piezoelectric layer 125. Also, although the temperature compensating layer 137 is shown encapsulated within the top electrode 135t, it is understood that it may extend the entire width of the top electrode 135t, or otherwise be only partially encapsulated within the top electrode 135t, without departing from the scope of the present teachings. Also, for example, a surface of the temperature compensating layer 137 may abut a surface of the piezoelectric layer 125, that is, when the interposer layer 136 is not present, as mentioned above.

In the top electrode 135t, the interposer and outside electrode layers 136 and 138 may be formed of the same or different electrically conductive materials, as discussed above with regard to outside electrode and interposer layers 116 and 118. In an embodiment, the outside electrode layer 138 may be formed of a material having relatively lower conductivity and relatively higher acoustic impedance, and the interposer layer 136 may be formed of a material having relatively higher conductivity and relatively lower acoustic impedance. For example, the outside electrode layer 138 may be formed of W and the interposer layer 136 may be formed of Mo, although other materials and/or combinations of materials may be used without departing from the scope of the present teachings. The temperature compensating layer 137 may be formed of various materials compatible with semiconductor processes, including BSG, SiO2, Cr or TeO(x), for example, which have positive temperature coefficients.

Referring to FIG. 1D, the acoustic resonator 100D is similar to the acoustic resonator 100B, except for placement of the temperature compensating feature, which is depicted as temperature compensating layer 127 in piezoelectric layer 125t. That is, the acoustic resonator 100D includes substrate 105, cavity 110 and perimeter DBR 106 around a perimeter of the cavity 110. Bottom electrode 115 is disposed on the perimeter DBR 106 over the substrate 105 and the cavity 110, and first planarization layer 120 is disposed on the perimeter DBR 106 adjacent to the bottom electrode 115. The piezoelectric layer 125t, including the temperature compensating layer 127, is disposed on the bottom electrode 115 and the first planarization layer 120, and the top electrode 135 is disposed on the piezoelectric layer 125t. The perimeter DBR 106 includes first and second acoustic impedance layers 107 and 108, where the first acoustic impedance layer 107 is formed of a material having relatively low acoustic impedance and the second acoustic impedance layer 108 is formed of a material having relatively high acoustic impedance, although additional acoustic impedance layers may be included.

More particularly, the piezoelectric layer 125t includes a first piezoelectric sub-layer 125t-1, temperature compensating layer 127 and second piezoelectric sub-layer 125t-2, stacked in this order on the bottom electrode 115. Thus, in the depicted embodiment, the temperature compensating layer 127 is buried in the piezoelectric layer 125t. In other words, the temperature compensating layer 127 is not formed on a top or bottom surface of the piezoelectric layer 125t and is therefore separated from adjacent components (e.g., bottom and top electrodes 115 and 135) in the acoustic stack. In the depicted embodiment, the temperature compensating layer 127 is positioned approximately half way through the total thickness of the piezoelectric layer 125t, for example. The first piezoelectric sub-layer 125t-1 and the second piezoelectric sub-layer 125t-2 of the piezoelectric layer 125t may be formed of the same material, with the temperature compensating layer 127 formed in between. The temperature compensating layer 127 may be formed of various materials compatible with semiconductor processes, including BSG, SiO2, Cr or TeO(x), for example, which have positive temperature coefficients. The positive temperature coefficient of the temperature compensating layer 127 offsets negative temperature coefficients of other materials in the acoustic stack, including the piezoelectric layer 125t, and the bottom and top electrodes 115 and 135. Also, although the temperature compensating layer 127 is shown encapsulated within the piezoelectric layer 125t, it is understood that it may extend the entire width of the piezoelectric layer 125t, or otherwise be only partially encapsulated within the piezoelectric layer 125t, without departing from the scope of the present teachings. Also, for example, a surface of the temperature compensating layer 127 may abut a surface of one of the bottom electrode 115 or the top electrode 135. In addition, similarly to the acoustic resonators 100B and 100C, the temperature compensating layer 127 may be encapsulated in metal layers placed below, above, or on both sides of the temperature compensating layer 127, without departing of the scope of the present teachings.

Generally, the addition of a temperature compensating layer, such as representative temperature compensating layers 117, 127 and/or 137 in acoustic resonators 100B, 100C and 100D, respectively, will decrease the electromechanical coupling coefficient $Kt^2$ of the corresponding acoustic resonator device. In order to compensate, the piezoelectric layer 125, 125t may be formed of materials with intrinsically higher piezoelectric coupling coefficient (e.g., ZnO instead of AlN). Also, in various embodiments, the piezoelectric layer 125, 125t may be "doped" with one or more rare earth elements, such as scandium (Sc), yttrium (Y), lanthanum (La), or erbium (Er), for example, to increase the piezoelectric coupling coefficient $e_{33}$ in the piezoelectric layer 125, 125t, thereby off-setting at least a portion of the degradation of the electromechanical coupling coefficient $Kt^2$ of the acoustic resonator caused by the temperature compensating layer 117, 127 or 137. Examples of doping piezoelectric layers with one or more rare earth elements for improving electromechanical coupling coefficient $Kt^2$ are provided by U.S. patent application Ser. No. 13/662,425 (filed Oct. 27, 2012), to Bradley et al., and U.S. patent application Ser. No. 13/662,460 (filed Oct. 27, 2012), to Grannen et al., which are hereby incorporated by reference in their entireties. Of course, doping piezoelectric layers with one or more rare earth elements may be applied to any of various embodiments, including the embodiments described below with reference to FIGS. 2A through 5B.

In various embodiments, the acoustic resonator with a perimeter acoustic reflector and a temperature compensating feature (in at least one of a bottom electrode, a top electrode or a piezoelectric layer) may include additional features, such as collars and/or frames. Various illustrative temperature compensating layers and fabrication techniques are described by U.S. patent application Ser. No. 13/955,774 (filed Jul. 31, 2013), to Burak et al., which is hereby incorporated by reference in its entirety. Generally, a collar couples the evanescent thickness extensional (eTE1) and piston modes of a main membrane region to the evanescent thickness extensional mode of a collar region, and a frame suppresses excitation of propagating modes. The frame may be a composite frame, having integrated lateral features, formed of aluminum (Al) and molybdenum (Mo), for example.

The collar may be formed of a relatively thick dielectric region of finite width, and may be located in various alternative locations, such as above the top electrode, below the bottom electrode, or between the bottom electrode and the piezoelectric layer. The collar may also be divided into multiple layers and formed in more than one of the above locations. Also, the collar may be formed inside other features of the acoustic resonator, for instance, inside the piezoelectric layer. A region of the acoustic resonator above and below the collar will be referred to as a collar region.

The collar is typically designed so that its cut-off frequency is substantially the same as the cutoff frequency in the main membrane region, and its main non-propagating mode (evanescent mode, for instance) has substantially the same modal distribution as the piston mode in the main membrane region. This prevents acoustic energy in the piston mode from being converted into unwanted propagating modes in the collar region and propagating and evanescent modes in the main membrane region. If excited, propagating modes in the collar region in general may lead to energy loss due to acoustic radiation to the region outside of acoustic resonator. Similarly, if excited, propagating and evanescent modes inside the main membrane region may in general produce lateral voltage gradients, which may lead to lateral current flows and energy loss due to the Joule heating. Thus, the collar may improve confinement of the piston mode within the main membrane region while suppressing the excitation of unwanted spurious lateral modes inside and outside of the main membrane region. This, in turn, may reduce overall acoustic scattering loss and enhance the parallel resistance Rp and the quality factor (Q-factor) of the acoustic resonator.

In the absence of the collar, there may be a significant acoustic impedance discontinuity at the edge of the top electrode for an electrically excited piston mode. Because the electric field is also terminated at the edge of top electrode, that edge will cause both mechanical and electrical excitation of evanescent, propagating and complex modes supported by the structures both inside and outside of the main membrane region. Evanescent and complex modes decay exponentially, so a wide enough collar structure will suppress them. Moreover, propagating modes may be suppressed by forming the collar structure with a proper width. Additionally, a collar structure extending over (or under) the top electrode may act as an integrated frame, thus it may minimize the amplitude of electrically excited piston mode before the top electrode edge and provide additional acoustic impedance discontinuities to suppress propagating modes. Thus, in the presence of a properly designed collar, most of the piston mode energy at the top electrode edge may couple to the evanescent mode in the collar region, which may then decay exponentially and become efficiently suppressed inside a wide enough collar structure. When the collar overlaps with the substrate, the perimeter DBR also prevents the evanescent and complex modes supported by the collar from coupling to the substrate.

The frame is formed by adding a layer of material, usually an electrically conducting material (although dielectric material is possible as well), to the top and/or bottom electrode. The frame can be either a composite frame or an add-on frame, for example. An add-on frame is formed by depositing the material above or below of a layer forming either the bottom or top electrode along a perimeter of the main membrane region. A composite frame is formed by embedding the material within the top or bottom electrode, typically with an exposed upper or lower surface being coplanar with an upper or lower surface of the top or bottom electrode. The use of a composite frame can simplify fabrication of the acoustic resonator with regard to application of layers on planar surfaces. For instance, it can prevent the formation of outcroppings in overlying layers, which can preserve the structural stability of the acoustic resonator. A region of the acoustic resonator above and below the frame will be collectively referred to as a frame region.

The frame generally suppresses electrically excited piston mode in the frame region, and it reflects and otherwise resonantly suppresses propagating eigenmodes in lateral directions, with both effects simultaneously improving operation of the acoustic resonator. This is because the frame's presence generally produces at least one of a cut-off frequency mismatch and an acoustic impedance mismatch between the frame region and other portions of the main membrane region. A frame that lowers the cut-off frequency in the frame region as compared to the main membrane region will be referred to as a Low Velocity Frame (LVF), while a frame that increases the cut-off frequency in the frame region as compared to the main membrane region will be referred to as a High Velocity Frame (HVF). The reasoning behind this nomenclature is that for composite frames (for which thicknesses of the frame and main membrane regions are substantially the same), an increase or decrease of the cut-off frequency is substantially equivalent to an increase or decrease an effective sound velocity of the acoustic stack forming the frame, respectively.

A composite or add-on frame with lower effective sound velocity than the corresponding effective sound velocity of a main membrane (i.e., an LVF) generally increases parallel resistance Rp and Q-factor of the acoustic resonator above the cut-off frequency of the main membrane region. Conversely, a composite or add-on frame with a higher effective sound velocity than the corresponding effective sound velocity of a main membrane (i.e., an HVF) generally decreases series resistance Rs and increases Q-factor of the acoustic resonator below the cut-off frequency of the main membrane region. A typical low velocity frame, for example, effectively provides a region with significantly lower cut-off frequency than the main membrane region and therefore minimizes the amplitude of the electrically excited piston mode towards the edge of the top electrode in the frame region. Furthermore, it provides two interfaces (impedance miss-match planes), which increase reflection of propagating eigenmodes. These propagating eigenmodes are mechanically excited at membrane/frame interface, and both mechanically and electrically excited at the top electrode edge. Where the width of the frame is properly designed for a given eigenmode, it results in resonantly enhanced suppression of that particular eigenmode. In addition, a sufficiently wide low velocity frame provides a region for smooth decay of the evanescent and complex modes, which are excited by similar mechanisms as the propagating eigenmodes. The combination of the above effects yields better energy confinement and higher Q-factor at a parallel resonance frequency Fp.

Various additional examples of collars and frames, as well as related materials and operating characteristics, are described in the above cited U.S. patent application Ser. Nos. 13/663,449 and 13/660,941 to Burak et al., which are hereby incorporated by reference in their entireties. As explained in those applications, collars and frames can be placed in various alternative locations and configurations relative to other portions of an acoustic resonator, such as the electrodes and piezoelectric layer of an acoustic stack. Additionally, their dimensions, materials, relative positioning, and so on, can be adjusted to achieve specific design objectives, such as a target resonant frequency, series resistance Rs, parallel resistance Rp, or electromechanical coupling coefficient $Kt^2$. Although the following description presents several embodiments in the form of FBAR devices, several of the described concepts could be implemented in other forms of acoustic resonators, such as SMRs, for example.

FIGS. 2A-2D are cross-sectional diagrams illustrating acoustic resonators, according to representative embodiments, including various arrangements of collars and frames.

Figure 2A:
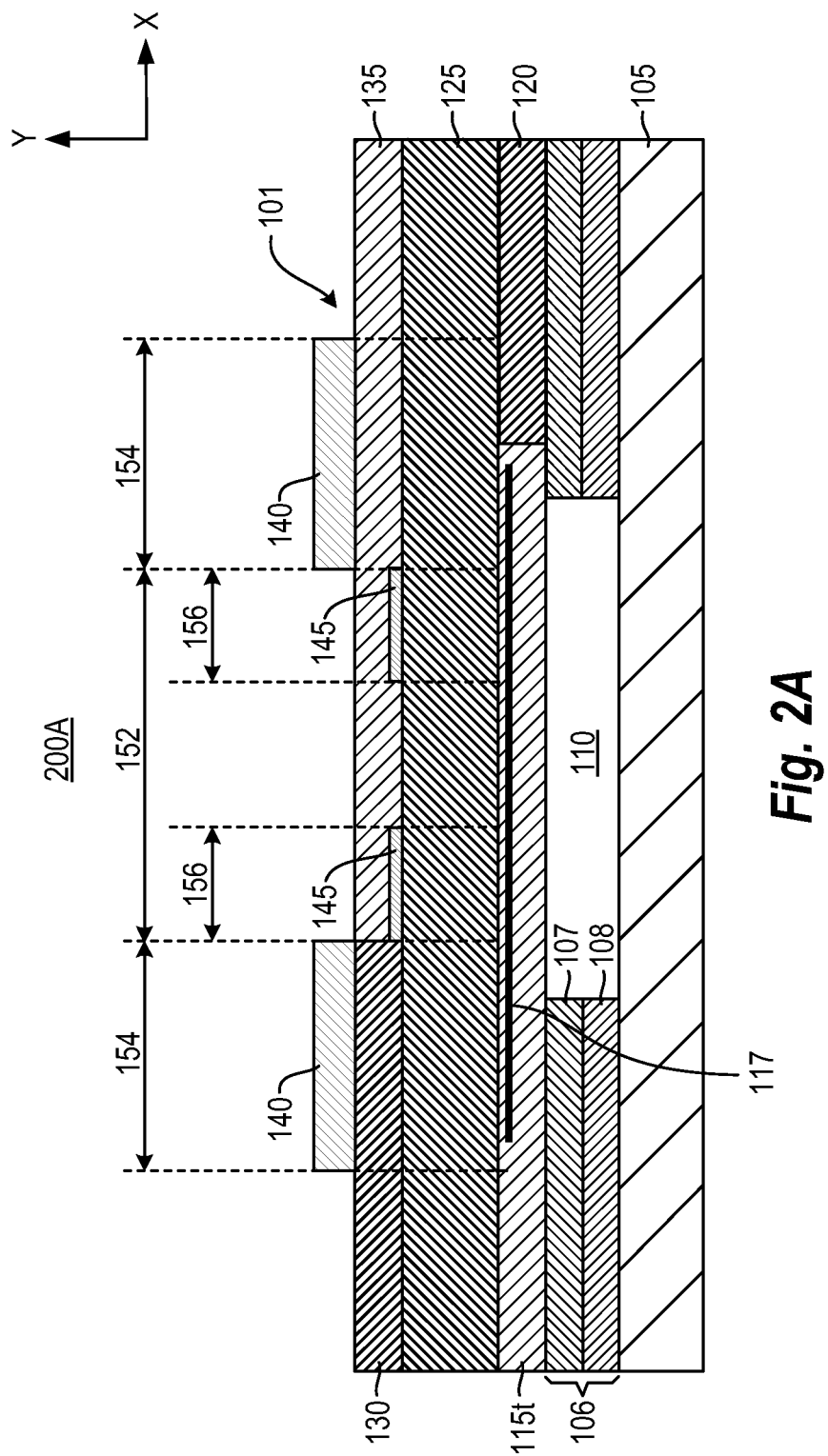
FIG. 2A is a cross-sectional view of an acoustic resonator according to another representative embodiment.

Referring to FIG. 2A, acoustic resonator 200A, which may be an FBAR, for example, comprises substrate 105, cavity 110 and DBR 106 (also referred to as an acoustic reflector herein) formed around a perimeter of the cavity 110 over a top surface of the substrate 105. Bottom electrode 115t is disposed on the perimeter DBR 106 over the substrate 105 and the cavity 110, and first planarization layer 120 is disposed adjacent to the bottom electrode 115t. Piezoelectric layer 125 is disposed on the bottom electrode 115t and the first planarization layer 120. Temperature compensating layer 117 is shown encapsulated in the bottom electrode 115t. However, in alternative configurations, the temperature compensating layer 117 may have at least one exposed portion (e.g., a top surface of the temperature compensating layer 117) contacting a bottom surface of the piezoelectric layer 125, such that the temperature compensating layer 117 is effectively formed between the bottom electrode 115t and the piezoelectric layer 125), as discussed above. Top electrode 135 is disposed on the piezoelectric layer 125, and a second planarization layer 130 is disposed on the piezoelectric layer 125 adjacent to the top electrode 135. Collectively, the bottom electrode 115, the piezoelectric layer 125, and the top electrode 135 constitute an acoustic stack of acoustic resonator 200A.

The acoustic resonator 200A further comprises a collar 140 disposed on the second planarization layer 130 and the top electrode 135, and a frame 145 disposed in a bottom portion of the top electrode 135. Although not shown, a passivation layer may be present on top of the top electrode 135 with thickness sufficient to insulate all layers of the acoustic stack from the environment, including protection from moisture, corrosives, contaminants, debris and the like. The collar 140 may be formed of a dielectric material of predetermined thickness and width that substantially surrounds the main membrane region. The dielectric material may be silicon dioxide ($SiO_2$), silicon nitride (SiN), silicon carbide (SiC), aluminum nitride (AlN), zinc oxide (ZnO), aluminum oxide ($Al_2O_3$), diamond, diamond like carbon (DLC), or lead zirconium titanate (PZT), for example. The frame 145 may be formed of one or more conductive or dielectric materials, such as W, Mo, Cu, $SiO_2$, SiN, AlN, ZnO, $Al_2O_3$, DLC, or SiC, for example.

The second planarization layer 130 may be formed of borosilicate glass (BSG), for example. Notably, the use of a high acoustic impedance material in the second planarization layer 130, for example, tends to produce a vertical modal energy distribution across the acoustic stack in the region of the collar 140 that matches more closely a vertical modal energy distribution across the acoustic stack in the active region. This allows a closer match between a vertical distribution of the modal energy distribution of electrically excited piston mode in the active region and a vertical modal energy distribution of the evanescent thickness extensional (eTE1) mode in the region of the collar 140 at frequencies around the series resonance frequency Fs of the acoustic resonator 200A. The eTE1 mode may then decay exponentially in the direction away from the collar/membrane interface without coupling to other propagating modes supported by the acoustic resonator 200A structure. This in turn may result in overall reduced scattering loss in the collar region and may produce significant improvements in parallel resistance Rp and quality factor Q. Moreover, use of higher acoustic impedance materials in the collar 140 and the passivation layer may also contribute to improved performance for similar reasons.

Of course, other materials may be incorporated into the above and other features of acoustic resonator 200A without departing from the scope of the present teachings.

A double-headed arrow 152 indicates a main membrane region, or active region, of the acoustic resonator 200A, and dotted vertical lines indicate a boundary of the main membrane region 152. This boundary coincides with the edge of the top electrode 135, except on connecting side 101, where the top electrode 135 extends beyond the boundary of the main membrane region 152. Double-headed arrows 154 and 156 indicate respective collar and frame regions of acoustic resonator 200A, and corresponding dotted vertical lines indicate boundaries of these regions. When viewed from a top angle, such as that of FIG. 1A, the above regions and their boundaries may have an apodized shape. As illustrated in FIG. 2A, the collar 140 has an inner edge that is substantially aligned with the boundary of the main membrane region 152, and the frame 145 has an outer edge that is substantially aligned with the same boundary. In general, the temperature compensating layer 117 may have an outer edge extending outside the collar region 154 on all sides except the connecting side 101 in order to facilitate substantially similar cutoff frequencies in the main membrane region 152 and the collar region 154. However, in other embodiments, the location of the outer edge of temperature compensating layer 117 may be optimized within the collar region 154 for additional resonant enhancement of performance of the acoustic resonator 200A, namely to increase the parallel resistance Rp and quality factor Q.

In the example of FIG. 2A, the main membrane region 152 does not include the full extent of overlap between bottom and top electrodes 115t and 135 and piezoelectric layer 125, because the illustrated right side of top electrode 135 is a connecting edge and it is not intended to modify the characteristic electrical impedance at an operating frequency range of the acoustic resonator 200A in any significant way. However, an overlap between the bottom electrode 115t, the piezoelectric layer 125, the top electrode 135 and the substrate 105 in the top electrode connecting edge, usually referred to as dead-FBAR, may cause significant acoustic energy loss since piston mode is electrically excited all the way to the outer perimeter of the cavity 110 in that region, where it may couple to propagating modes supported by the substrate 105 region. The presence of the collar 140 in that region may minimize that unwanted energy loss by mass-loading the top-electrode connecting edge, which in turn significantly lowers the amplitude of electrically excited piston mode at an outer edge of the cavity 110.

During typical operation of acoustic resonator 200A, as a part of a ladder filter, for instance, an input electrical signal may be applied to an input terminal of the bottom electrode 115t and the top electrode 135 may be connected to the output terminal. The input electrical signal may include a time-varying voltage that causes vibration in the main membrane region. This vibration in turn produces an output electrical signal at an output terminal of the top electrode 135. The input and output terminals may be connected to bottom and top electrodes 115t and 135 via connection edges that extend away from the main membrane region 152 as shown in FIG. 2A. For example, from a top view, these connection edges may be seen to extend outside of an apodized pentagon shape, such as that illustrated in FIG. 1A. The input and output terminals of acoustic resonator 200A may be connected to appropriate terminals of other acoustic resonators forming the ladder filter, for instance.

The electrically excited piston mode is terminated at the edge of top electrode 135. This structural discontinuity at the edge of top electrode 135 presents a significant discontinuity in cutoff frequencies between the main membrane 152 and peripheral regions, and it causes excitation of lateral modes in both the main membrane and peripheral regions to facilitate continuity of appropriate particle velocity and stress components at the interface between these regions. This can lead to undesirable scattering of acoustic energy from the piston mode and the resulting degradation of electrical response of acoustic resonator 200A. Collar 140, however, provides mass loading which lowers the cutoff frequency outside the main membrane region 152, producing a more laterally uniform cutoff frequency profile across acoustic resonator 200A. Similarly, frame 145 suppresses electrically excited piston mode in the frame region, and it reflects and otherwise resonantly (exponentially) suppresses propagating (evanescent and complex) eigenmodes in lateral directions, with both effects simultaneously improving operation of acoustic resonator 200A. In other words, performance improvement of acoustic resonator 200A is facilitated by at least one of a cut-off frequency mismatch and an acoustic impedance mismatch between the frame region and other portions of the main membrane region 152 which is produced by frame 145.

Meanwhile, the perimeter DBR 106 generally mitigates acoustic losses in the vertical direction (y-dimension in the coordinate system depicted in FIG. 2A) of the acoustic resonator 200A, and the temperature compensating layer 117 stabilizes response by offsetting at least a portion of a negative temperature coefficient of the piezoelectric layer 125, the bottom electrode 115$t$ and/or the top electrode 135. The principle of operation of the perimeter DBR 106 relies on the fact that, due to destructive interference of an incident acoustic wave, its total amplitude decays exponentially in the direction of propagation through the acoustic stack (in this case away from the interface between bottom electrode 115$t$ and first acoustic impedance layer 107). In general, such beneficial exponential decay of wave amplitude is only possible if the thicknesses of the first and second acoustic impedance layers 107 and 108 (and any additional acoustic impedance layers) comprising perimeter DBR 106 are equal to or close to equal to an odd multiple of the quarter wavelength of an incident acoustic wave. At the bottom of the perimeter DBR stack (in this case at the interface between second acoustic impedance layer 108 and the substrate 105), the wave amplitude is small, thus yielding negligible radiation of acoustic energy into the substrate 105. In other words, the acoustic energy incident upon the perimeter DBR 106 is being reflected back with only small transmission of acoustic energy into the substrate 105. Notably, the beneficial reflectivity properties of the perimeter DBR 106 are in general possible for a limited range of frequencies, a specific polarization and a limited range of propagation angles of an incident wave. In practical cases when the range of frequencies is given by a bandwidth of a filter and multiple eigenmodes are being excited in the active region, the optimal thicknesses of the various acoustic impedance layers are found numerically and experimentally.

As mentioned above, the first acoustic impedance layer 107 has a comparatively low acoustic impedance and is provided beneath the bottom electrode 115$t$ and the first planarization layer 120, and the second acoustic impedance layer 108 has a comparatively high acoustic impedance is disposed beneath the first acoustic impedance layer 107. Also as mentioned above, the use of two acoustic impedance layers (e.g., the first and second acoustic impedance layers 107, 108) is merely illustrative, and the perimeter DBR 106 may comprise more than two acoustic impedance layers, or a single acoustic impedance layer. Notably, a plurality of acoustic impedance layers of alternating (e.g., stacked low-high-low-high) acoustic impedances may be provided around the perimeter of the cavity 110. The number of acoustic impedance layers provided for the perimeter DBR is determined by a tradeoff between expected reflection performance (the more layers the better) and cost and processing issues (the fewer layers the cheaper and more straightforward mirror growth and post-processing). Furthermore, depending on the acoustic impedance of the substrate 105, the second acoustic impedance layer 108 may be foregone, with the first acoustic impedance layer 107 being disposed directly over the substrate 105.

The amount of acoustic isolation of the excited eigenmodes provided by the perimeter DBR 106 also depends on the contrast between the acoustic impedances of the adjacent acoustic impedance layers, with a greater amount of contrast creating better acoustic reflection of the eigenmodes with dominant vertical polarization component, as discussed above. In some embodiments, the first and second acoustic impedance layers 107 and 108 are formed of a pair of dielectric materials having contrasting acoustic impedances. One example of such a pair of dielectric materials comprises alternating layers of sputter-deposited silicon carbide (SiC) and PECVD SiC. Notably, the sputter-deposited SiC layer has comparatively high acoustic impedance and the PECVD SiC layer has a comparatively low acoustic impedance. As such, according to one embodiment, the first acoustic impedance layer 107 comprises PECVD SiC and the second acoustic impedance layer 108 comprises sputter-deposited SiC. Another example of such a pair of dielectric layers is carbon-doped silicon oxide (CDO) and silicon nitride. As such, according to another representative embodiment, the first acoustic impedance layer 107 comprises CDO and the second acoustic impedance layer 108 comprises silicon nitride.

The perimeter DBR 106 may be formed before the formation of the cavity 110 and the subsequent layers of the acoustic resonator 200A. In particular, the layers of the perimeter DBR 106 are provided over the substrate 105 using selected materials deposited by known methods. For example, the second acoustic impedance layer 108 may be formed over the substrate 105, and the first acoustic impedance layer 107 is formed over the second acoustic impedance layer 108. Alternatively, the first acoustic impedance layer 107 may be formed over the substrate 105 directly. Still alternatively, additional acoustic impedance layers (not shown) may be provided between the second acoustic impedance layer 108 and the first acoustic impedance layer 107. In all embodiments, however, the first acoustic impedance layer 107, which has comparatively low acoustic impedance, is provided beneath the bottom electrode 115$t$. The layers of the perimeter DBR 106 can be fabricated using various known methods, an example of which is described in U.S. Pat. No. 7,358,831 (Apr. 15, 2008) to Larson, III, et al., the disclosure of which is hereby incorporated by reference in its entirety.

In general, the main membrane region 152 of FBAR 200A is defined by the presence of air (essentially zero acoustic impedance material) at both top and bottom boundaries. Therefore vertical stress components are zero at these boundaries. Similarly, through proper selection of materials in the perimeter DBR 106, the first acoustic impedance layer 107 may have very low acoustic impedance compared to the bottom electrode 115$t$, which may also lead to a lowered vertical stress at the boundary between the bottom electrode 115$t$ and the first acoustic impedance layer 107. Such a lowered stress condition is however only possible when thickness of the first acoustic impedance layer 107 is reasonably close to an odd multiple of the quarter wavelength of the fundamental eigenmode (e.g., in this case eTE1 mode) for which the perimeter DBR 106 is being designed. Adding more acoustic impedance layers to the perimeter DBR 106 further lowers the vertical stress at the interface between the bottom electrode 115$t$ and the first acoustic impedance layer 107, thus allowing for closer approximation of an ideal zero-stress condition.

However, as mentioned above, while lower vertical stress for the eTE1 mode is realized by the selection of the thickness of the first acoustic impedance layer 107, for other modes which are excited either electrically or mechanically (by modal coupling at the lateral edges of the membrane) that may not necessarily be the case and leakage of these modes through the perimeter DBR 106 may be actually enhanced (leading to lesser than expected energy confinement). For instance, presence of relatively thick first acoustic impedance layer 107 with low acoustic impedance generally lowers the cut-off frequency of the second order thickness shear mode TS2, which in turn increases the shear component in the eTE1 mode at the parallel resonant frequency Fp resulting in weaker coupling of eTE1 modes supported by the collar 140 on either side of the cavity 110 edge. That weaker coupling causes stronger excitation of propagating modes and increased radiative loss, as described above in relation to collar operating principles. In other words, proximity of TS2 resonance to TE1 resonance in the perimeter DBR 106 region may increase lateral leakage of acoustic energy. To address that problem, a thinner than quarter wavelength first acoustic impedance layer 107 may be used, which in turn may adversely reduce overall reflectivity of perimeter DBR 106 in vertical direction. The proper balance between these two leakage mechanisms is usually determined by numerical simulations and experiments.

In general, the depth of the cavity 110 is determined by the etch properties of the sacrificial material and by possible downward bowing of the released membrane (i.e., layers of the acoustic resonator 200A disposed over the cavity 110) in the case of residual compressive stress in the layers of the membrane being present. Usually deeper cavities are more beneficial from the membrane release process point of view, but they also yield somewhat more difficult initial etch process. If the above mentioned features of the release process require deeper cavities than the thickness of the first acoustic impedance layer 107, one can increase the depth of the cavity 110 by continued etching the second acoustic impedance layer 108 and the substrate 105 until required distance between bottom electrode 115$t$ and bottom of the cavity 110 is obtained. In various embodiments, a thickness of the perimeter DBR 106 may be substantially the same as the depth of the cavity 110, less than the depth of the cavity 110, or greater than the depth of the cavity 110, without departing from the scope of the present teachings.

The first and second acoustic impedance layers 107 and 108 have thicknesses in the range of approximately 1000 Å to approximately 50000 Å, respectively, depending on the material used and the frequency operating range of the filter. As mentioned above, the total thickness of all acoustic impedance layers comprising the perimeter DBR 106 is substantially equal to one quarter-wavelength of the fundamental eigenmode in the selected material and excited at the selected operational frequency (e.g., series resonance frequency). For example, if the first acoustic impedance layer 107 comprises CDO for operation at about 800 MHz (series resonance frequency), the first acoustic impedance layer 107 has a thickness of approximately 1.2 μm. In this example, second acoustic impedance layer 108 may comprise SiN, having a thickness of approximately 3.2 μm for operation at about 800 MHz. Notably, the thickness of all acoustic impedance layers of the perimeter DBR 106 can be selected to be odd-multiple (e.g., 5) quarter-wavelengths of the fundamental acoustic resonator eigenmode in the selected material (e.g., if one quarter-wavelength layer is too thin for practical processing).

Figure 2B:
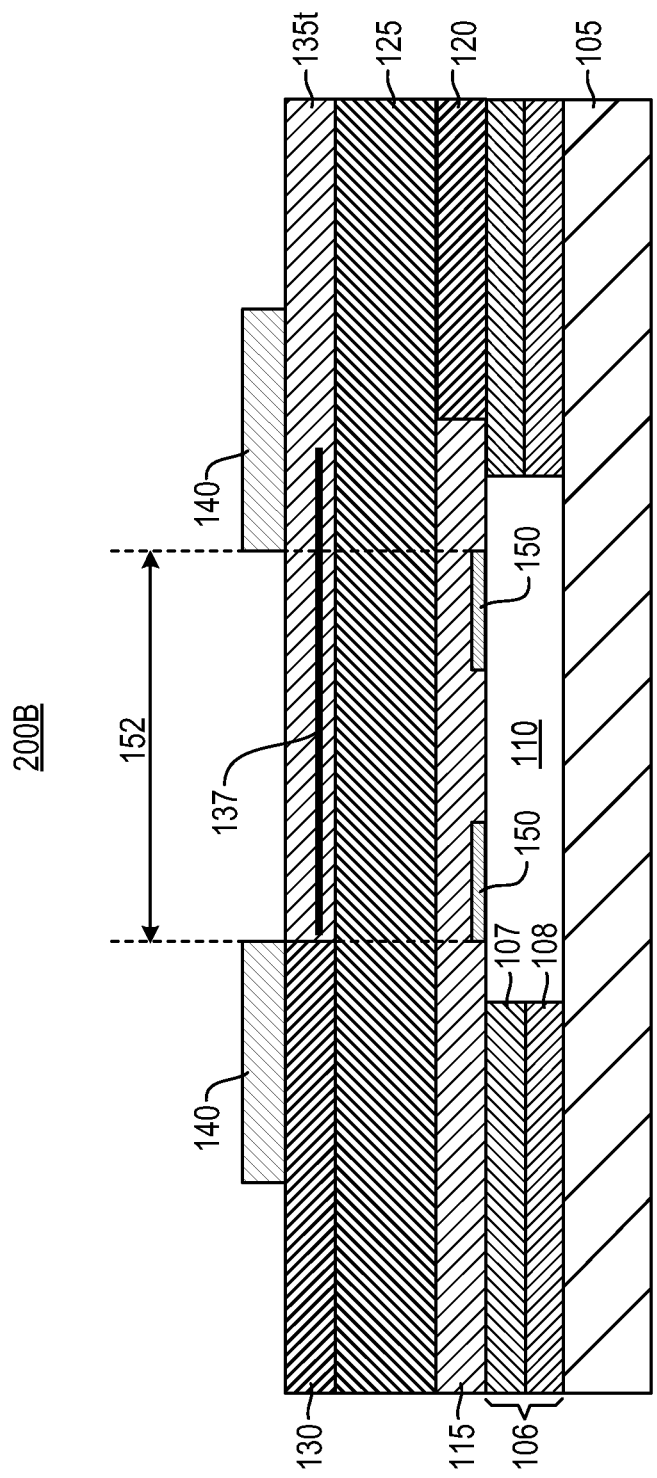
FIG. 2B is a cross-sectional view of an acoustic resonator according to another representative embodiment.
Figure 2C:
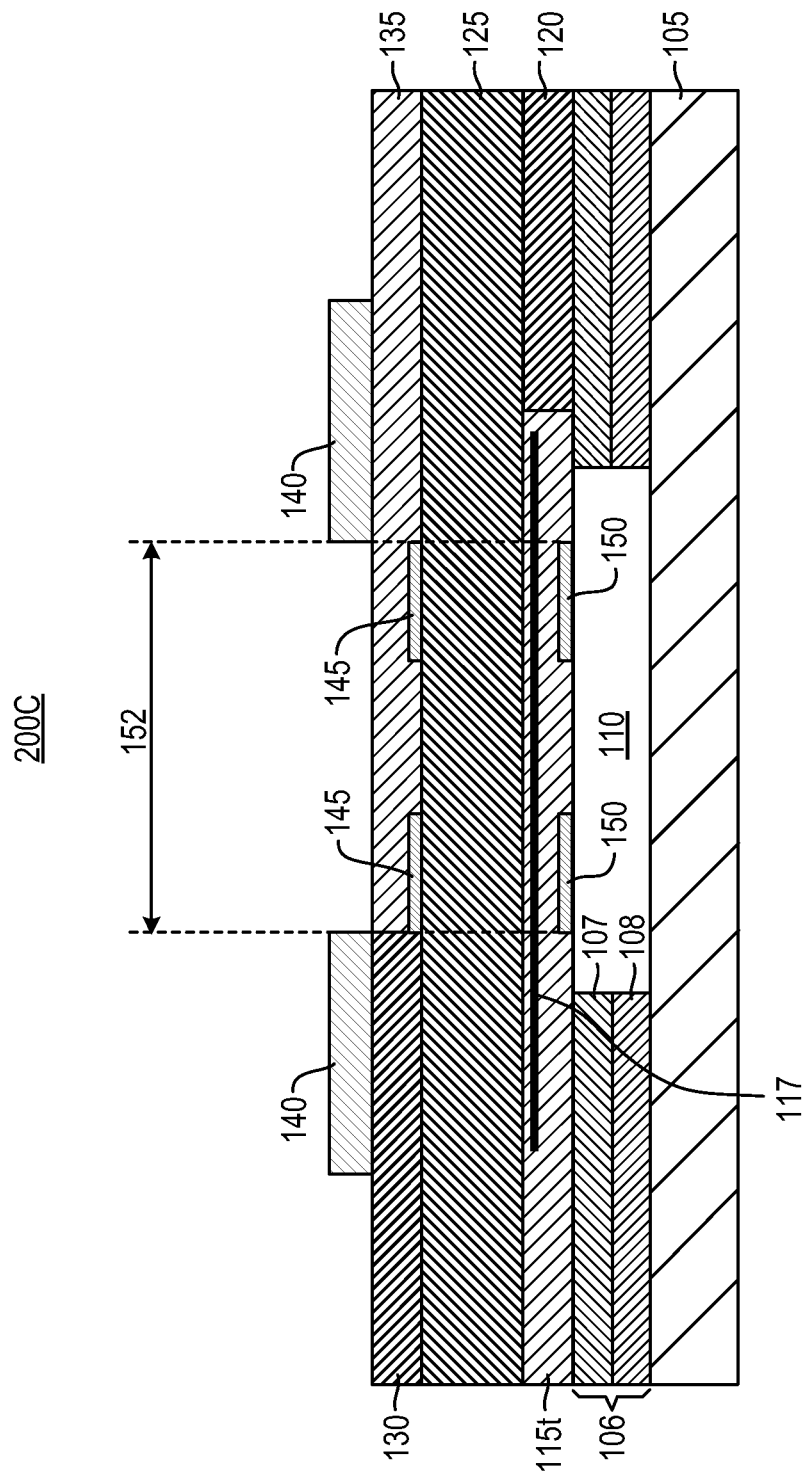
FIG. 2C is a cross-sectional view of an acoustic resonator according to another representative embodiment.

FIGS. 2B, 2C and 2D depict variations of the acoustic resonator 200A. In particular, in FIG. 2B, acoustic resonator 200B is substantially the same as acoustic resonator 200A, except that frame 145 is omitted and frame 150 is located at a bottom portion of bottom electrode 115, and that temperature compensating layer 117 is omitted and temperature compensating layer 137 is included in top electrode 135$t$. In FIG. 2C, acoustic resonator 200C is substantially the same as acoustic resonator 200A, except that frame 150 is provided at a bottom portion of bottom electrode 115$t$, in addition to frame 145 in the top electrode 135. In FIG. 2D, acoustic resonator 200D is substantially the same as acoustic resonator 200A, except that frame 150' is provided at a top portion of bottom electrode 115, and that temperature compensating layer 117 is omitted and temperature compensating layer 127 is included in piezoelectric layer 125$t$. The frames 150 and 150' in acoustic resonators 200B through 200D provide benefits similar to frame 145 of acoustic resonator 200A, although their performance and manufacturing processes will vary somewhat due to the different locations of the frames. Some general tradeoffs of different frame configurations are described, for instance, in the above cited U.S. patent application Ser. No. 13/660,941. Likewise, the temperature compensating layers 137 and 127 in acoustic resonators 200B and 200D provide benefits similar to temperature compensating layer 117 in acoustic resonators 200A and 200C, although their performance and manufacturing processes will vary somewhat due to the different locations in the acoustic stack.

It is understood that, although not specifically depicted for the sake of convenience, the various features shown in FIGS. 2A through 2D in addition to the collar 140 may be configured in various alternative combinations, without departing from the scope of the present teachings. For example, with reference to FIG. 2A, a temperature compensating layer may be included in the piezoelectric layer 125 and/or the top electrode 135, together with the frame 145, instead of or in addition to the temperature compensating layer 117 in the bottom electrode 115$t$. With reference to FIG. 2B, a temperature compensating layer may be included in the piezoelectric layer 125 and/or the bottom electrode 115, together with the frame 150, instead of or in addition to the temperature compensating layer 137 in the top electrode 135$t$. With reference to FIG. 2C, a temperature compensating layer may be included in the piezoelectric layer 125 and/or the top electrode 135, together with the frames 145 and/or 150, instead of or in addition to the temperature compensating layer 117 in the bottom electrode 115$t$. Likewise, with reference to FIG. 2D, a temperature compensating layer may be included in the bottom electrode 115 and/or the top electrode 135, together with the frame 145 and/or the frame 150', instead of or in addition to the temperature compensating layer 127 in the piezoelectric layer 125$t$.

FIGS. 3A through 3D are cross-sectional views of acoustic resonators 300A through 300D, respectively, according to other representative embodiments. The acoustic resonators 300A through 300D are similar to acoustic resonators 200A through 200D, respectively, except that collar 140 is omitted and a collar 240 is instead formed between bottom electrode 115$t$, 215 or 215' and piezoelectric layer 125 or 125$t$. The collar 240 provides benefits similar to the collar 140 of acoustic resonators 200A through 200D, although its performance and manufacture varies somewhat due to the different location of the collar 240.

Figure 3A:
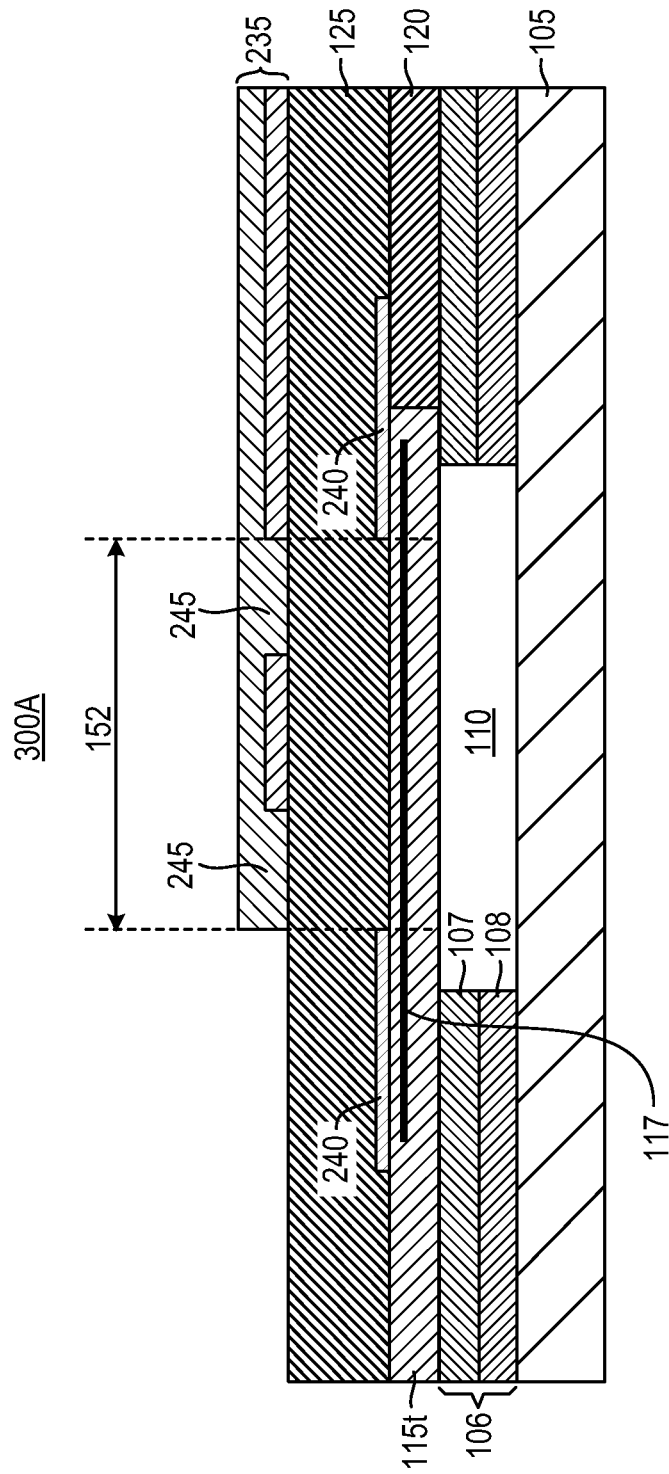
FIG. 3A is a cross-sectional view of an acoustic resonator according to another representative embodiment.

Note that for illustrative purposes, the frame 245 formed in the top electrode 235 and frames 250 and 250' formed in the bottom electrode 215 of the acoustic resonators 200A through 200D are constructed differently than the frame 145 of in the top electrode 135 and the frames 150 and 150' formed in the bottom electrode 115 or 115' of the acoustic resonators 200A through 200D, respectively, although the functionality of the frames 245, 250 and 250' is substantially the same as discussed above. In particular, the top electrode 235 in FIGS. 3A, 3C and 3D is a composite electrode comprising two different metal materials to provide integrated lateral features (frames 245). Likewise, the bottom electrode 215 in FIGS. 3B, 3C and 3D are also composite electrodes comprising two different metal materials to provide integrated lateral features (frames 250, 250').

Generally, the frame 245 comprises an inside electrode layer formed on the piezoelectric layer 125 and an outside electrode layer formed on the inside electrode layer. The outside electrode layer is formed of a first material and the inside electrode layer is formed of the first material and a second material, where the first material effectively extends from the outside electrode layer through the second material of the inside electrode layer to provide the frame 245 (in a bottom portion of the top electrode 235). The second material may have higher (lower) sound velocity than the first material in order to form a low (high) velocity frame. For example, for low velocity frame the second material may be formed of molybdenum (Mo) or aluminum (Al) and the first material may be tungsten (W), although other materials may be incorporated without departing from the scope of the present teachings. The frame 250 comprises an inside electrode layer formed beneath the piezoelectric layer 125 and an outside electrode layer formed beneath the inside electrode layer. The inside electrode layer is formed of the first material and the outside electrode layer is formed of the first and second materials, where the first material effectively extends from the inside electrode layer through the second material of the outside electrode layer to provide the frame 250 (in a bottom portion of the bottom electrode 215). Similarly, the frame 250' comprises an inside electrode layer formed beneath the piezoelectric layer 125 and an outside electrode layer formed beneath the inside electrode layer. The outside electrode layer is formed of the first material and the inside electrode layer is formed of the first and second materials, where the first material effectively extends from the outside electrode layer through the second material of the inside electrode layer to provide the frame 250' (in a top portion of the bottom electrode 215).

The frames may be realized by other types and locations of integrated lateral features formed by composite electrodes, without departing from the scope of the present teachings. Examples of composite electrodes with integrated lateral features are provided by U.S. patent application Ser. No. 13/660,941, filed Oct. 25, 2012, which is hereby incorporated by reference in its entirety. Also, some general tradeoffs of different frame configurations are described, for instance, in the above cited U.S. patent application Ser. No. 13/663,449. Of course, the structures of the frames 245, 250 and 250' may be applied to the acoustic resonators 200A through 200D, and the structures of the frames 145, 150 and 150' may be applied to the acoustic resonators 300A through 300D, without departing from the scope of the present teachings.

Figure 3B:
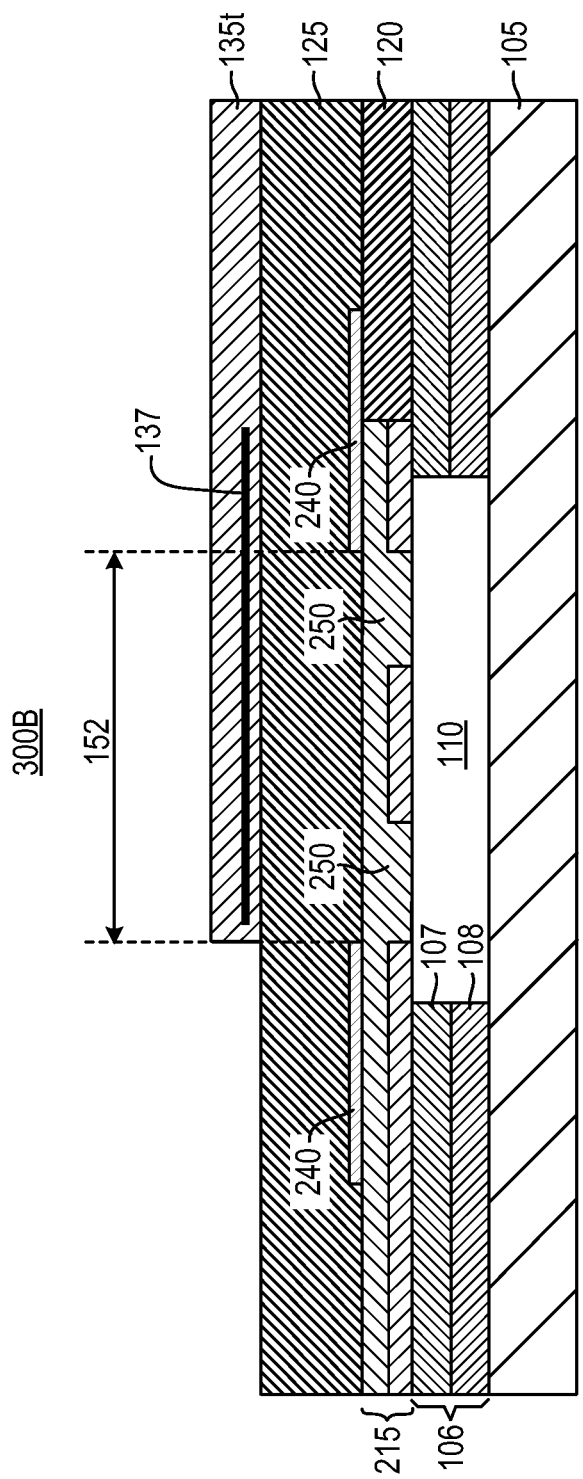
FIG. 3B is a cross-sectional view of an acoustic resonator according to another representative embodiment.
Figure 3C:
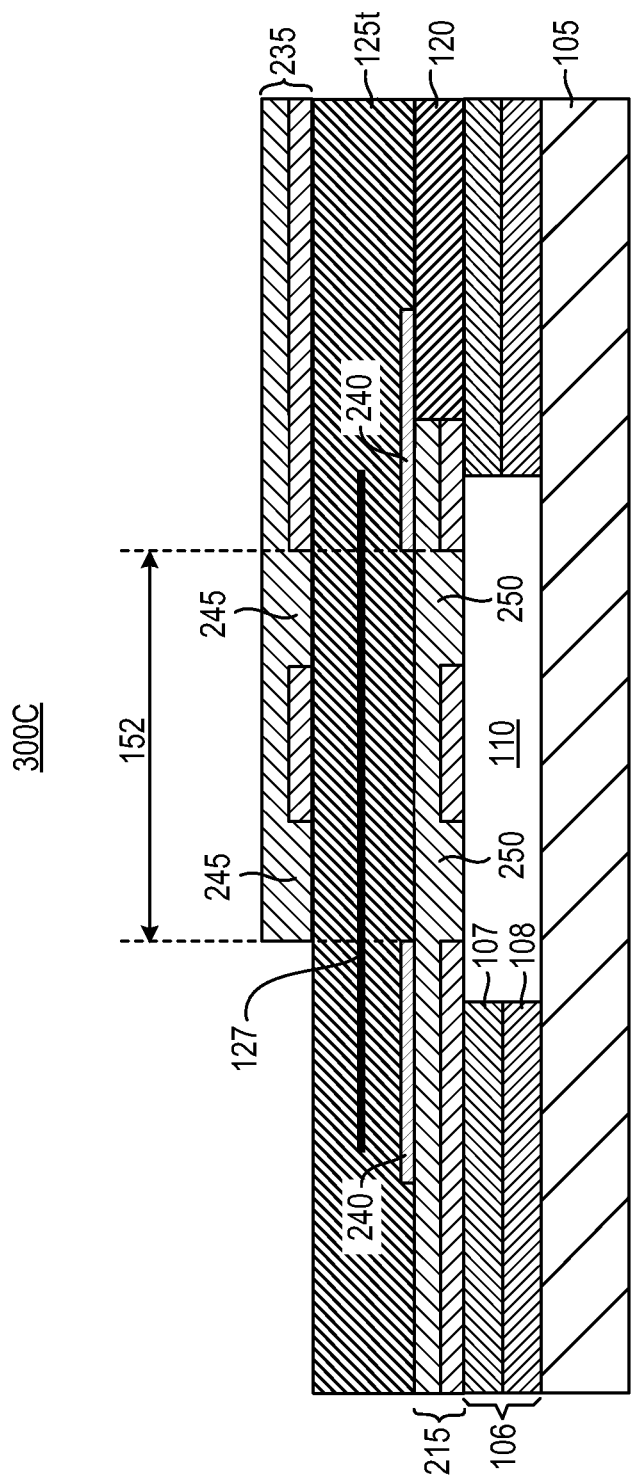
FIG. 3C is a cross-sectional view of an acoustic resonator according to another representative embodiment.
Figure 3D:
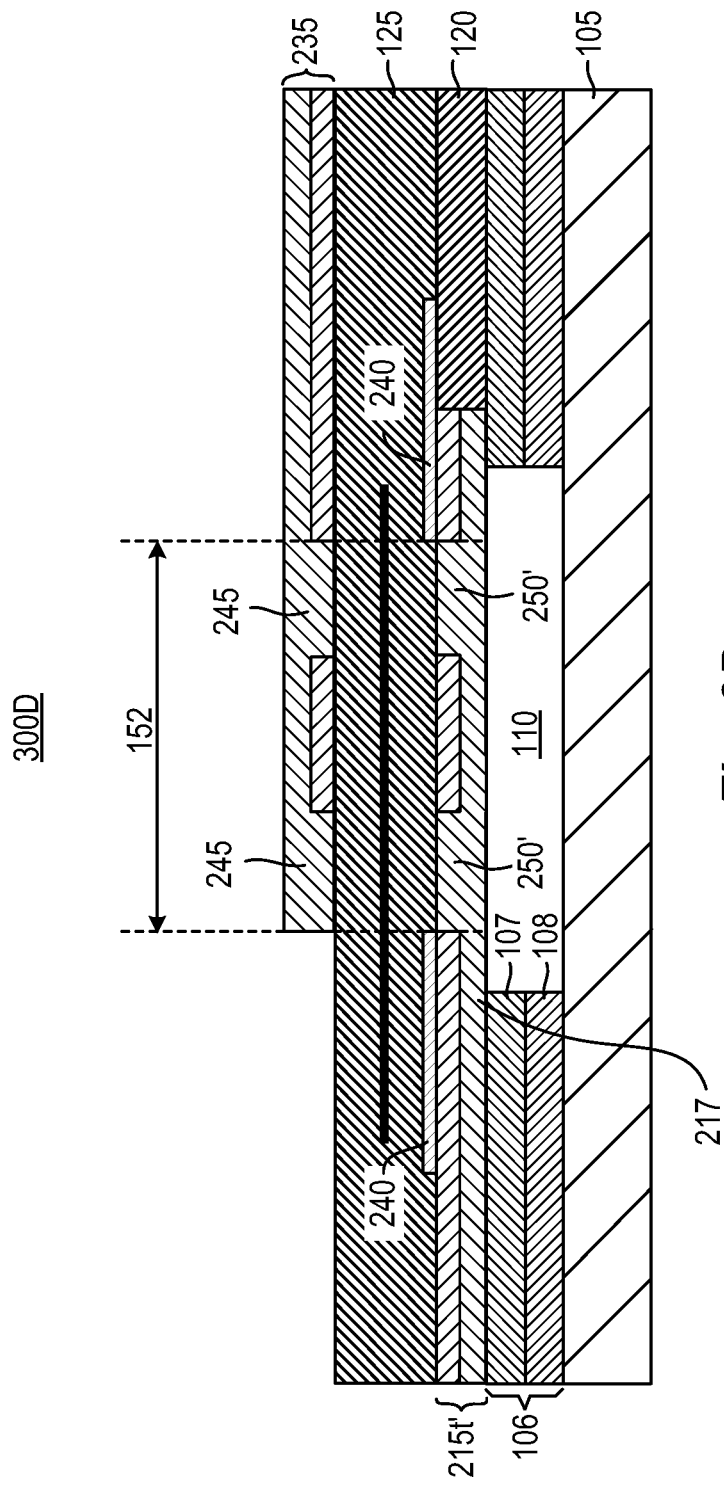
FIG. 3D is a cross-sectional view of an acoustic resonator according to another representative embodiment.

It is understood that, although not specifically depicted for the sake of convenience, the various features shown in FIGS. 3A through 3D in addition to the collar 240 may be configured in various alternative combinations, without departing from the scope of the present teachings. For example, with reference to FIG. 3A, a temperature compensating layer may be included in the piezoelectric layer 125 and/or the top electrode 235, together with the frame 245, instead of or in addition to the temperature compensating layer 117 in the bottom electrode 115t. With reference to FIG. 3B, a temperature compensating layer may be included in the piezoelectric layer 125 and/or the bottom electrode 215, together with the frame 250, instead of or in addition to the temperature compensating layer 137 in the top electrode 135t. With reference to FIG. 3C, a temperature compensating layer may be included in the bottom electrode 215 and/or the top electrode 235, together with the frame 245 and/or the frame 250, instead of or in addition to the temperature compensating layer 127 in the piezoelectric layer 125t. Likewise, with reference to FIG. 3D, a temperature compensating layer may be included in the bottom electrode 215 and/or the top electrode 235, together with the frames 245 and/or 250', instead of or in addition to the temperature compensating layer 127 in the piezoelectric layer 125t.

FIGS. 4A through 4D are cross-sectional views of acoustic resonators 400A through 400D, respectively, according to other representative embodiments. The acoustic resonators 400A through 400D are similar to acoustic resonators 200A through 200D, respectively, except that collar 140 is omitted and a collar 340 is instead formed between bottom electrode 315 and perimeter DBR 106 (and/or substrate 105). In other words, the collar is formed below the bottom electrode 315 or 315t. The collar 340 provides benefits similar to the collar 140 of acoustic resonators 200A through 200D, although its performance and manufacture varies somewhat due to the different location of the collar 340.

In the depicted embodiment, an additional first planarization layer 320' is disposed on the perimeter DBR 106 and/or substrate 105 adjacent to the collar 340, providing a substantially planar upper surface on which the bottom electrode 315, 315t and the first planarization layer 320 are formed. The first planarization layer 320 is disposed on the additional first planarization layer 320' and the collar 340 adjacent to the bottom electrode 315 or 315t providing a substantially planar upper surface on which the piezoelectric layer 125 or 125t is formed. The collar 340 extends into a portion of the cavity 110. The first planarization layer 320 and the additional first planarization layer 320' may be formed of borosilicate glass (BSG), for example.

Figure 4A:
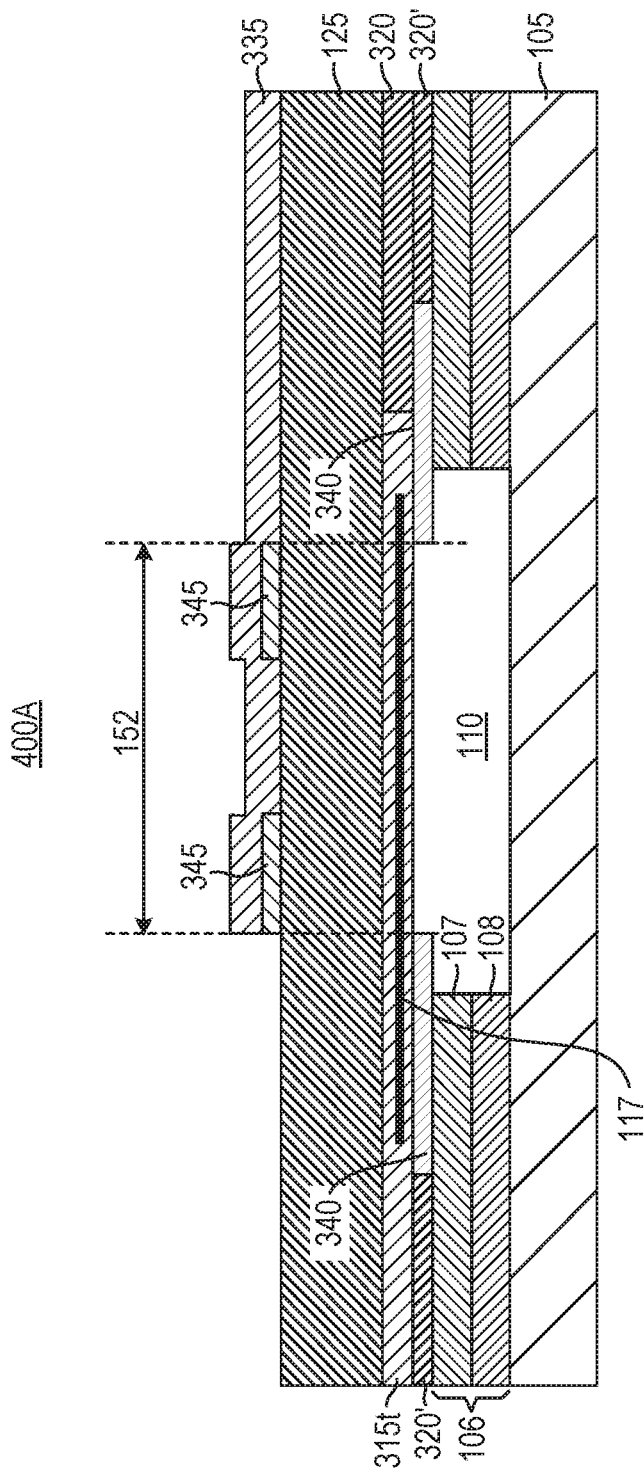
FIG. 4A is a cross-sectional view of an acoustic resonator according to another representative embodiment.
Figure 4B:
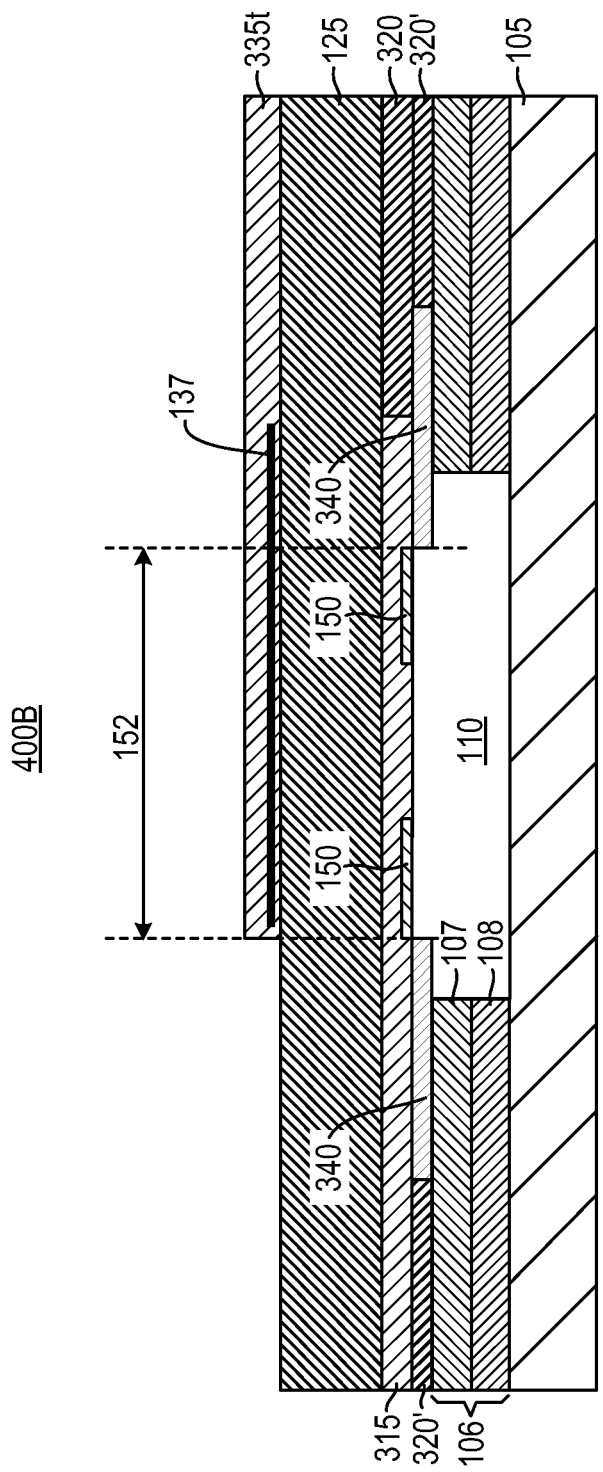
FIG. 4B is a cross-sectional view of an acoustic resonator according to another representative embodiment.
Figure 4C:
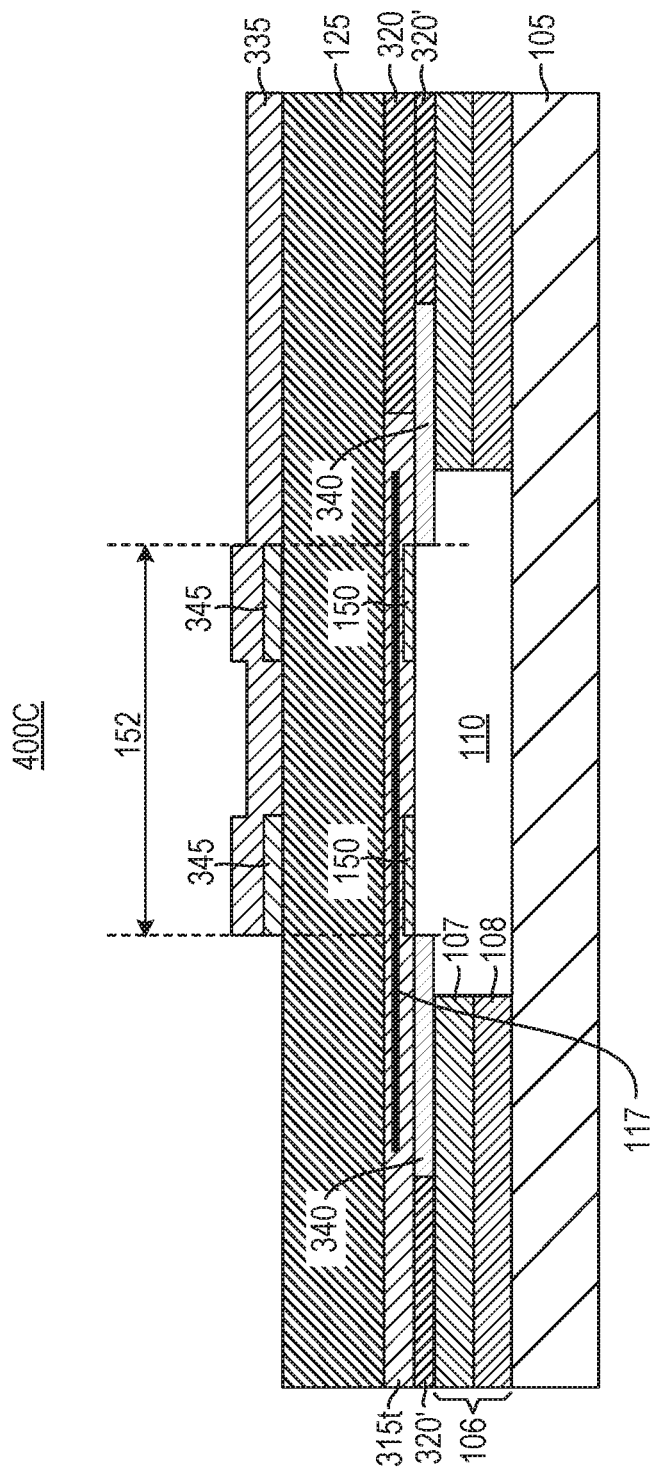
FIG. 4C is a cross-sectional view of an acoustic resonator according to another representative embodiment.
Figure 4D:
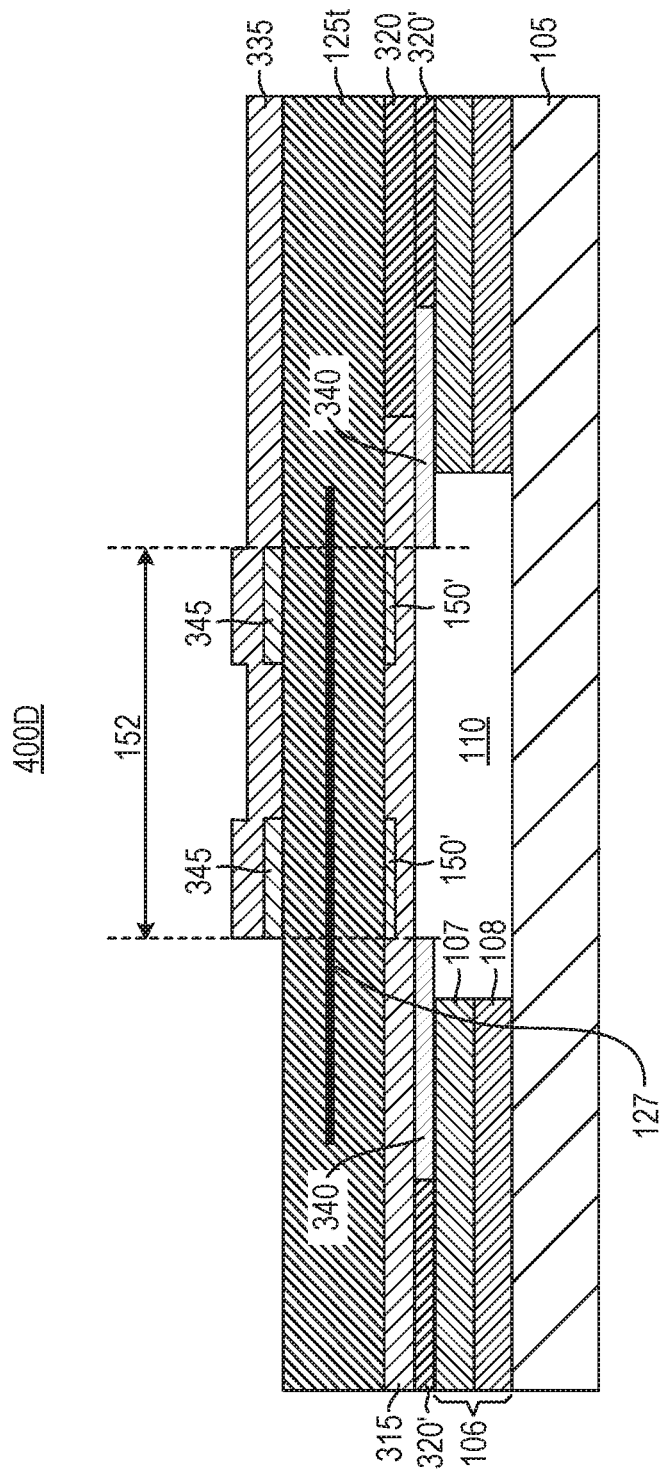
FIG. 4D is a cross-sectional view of an acoustic resonator according to another representative embodiment.

Unlike acoustic resonators 200A through 300D, in which all frames are composite frames (integrally formed within corresponding electrodes to provide planar top surfaces), the frames 345 in top electrodes 335 of the acoustic resonators 400A, 400C and 400D shown in FIGS. 4A, 4C and 4D, respectively, are add-on frames. Add-on frames result in substantially non-planar top surface profiles of the top electrode 335 in the acoustic resonators 400A, 400C and 400D. Generally, because usually only a passivation layer would be formed on top electrode 335, such non-planar profiles of the top electrode 335 would not have any significant impact on structural robustness of acoustic resonators 400A, 400C and 400D. On the other hand, frames 150 and 150' formed in the bottom electrode 315 or 315t of the acoustic resonators 400B, 400C and 400D are composite frames, resulting in substantially planar top surface profiles of the bottom electrodes 315 and 315'. Such substantially planar top surfaces are preferable in the bottom electrodes 315 and 315' in order to form a high quality, void-free piezoelectric layer 125 or 125t and top electrode 335 or 335t above the bottom electrode 315 or 315t. Some additional general tradeoffs of different frame configurations are described, for instance, in the above cited U.S. patent application Ser. No. 13/663,449. Of course, the structure of the add-on frame 345 may be applied to the acoustic resonators 200A through 300D and the structure of the frame 145 may be applied to the acoustic resonators 400A through 400D, without departing from the scope of the present teachings. In addition, other frame configurations (add-on and composite) may be incorporated, such as addition frame configurations disclosed by U.S. patent application Ser. No. 13/781,491, filed Feb. 28, 2013, for example, without departing from the scope of the present teachings.

It is understood that, although not specifically depicted for the sake of convenience, the various features shown in FIGS. 4A through 4D in addition to the collar 340 may be configured in various alternative combinations, without departing from the scope of the present teachings. For example, with reference to FIG. 4A, a temperature compensating layer may be included in the piezoelectric layer 125 and/or the top electrode 335, together with the frame 145, instead of or in addition to the temperature compensating layer 117 in the bottom electrode 315t. With reference to FIG. 4B, a temperature compensating layer may be included in the piezoelectric layer 125 and/or the bottom electrode 315, together with the frame 150, instead of or in addition to the temperature compensating layer 137 in the top electrode 335t. With reference to FIG. 4C, a temperature compensating layer may be included in the piezoelectric layer 125 and/or the top electrode 335, together with the frames 145 and/or 150, instead of or in addition to the temperature compensating layer 117 in the bottom electrode 315t. Likewise, with reference to FIG. 4D, a temperature compensating layer may be included in the bottom electrode 315 and/or the top electrode 335, together with the frame 145 and/or the frame 150', instead of or in addition to the temperature compensating layer 127 in the piezoelectric layer 125t.

Also, in alternative embodiments, the various features of the acoustic resonators 200A through 400D may be provided in various combinations that include either a collar or one or more frames, but not both collars and frames, without departing from the scope of the present teachings. For example, FIGS. 5A and 5B are cross-sectional views of acoustic resonators 500A 500B, respectively, according to other representative embodiments, which include frames or collars, along with other illustrative features discussed above.

Figure 5B:
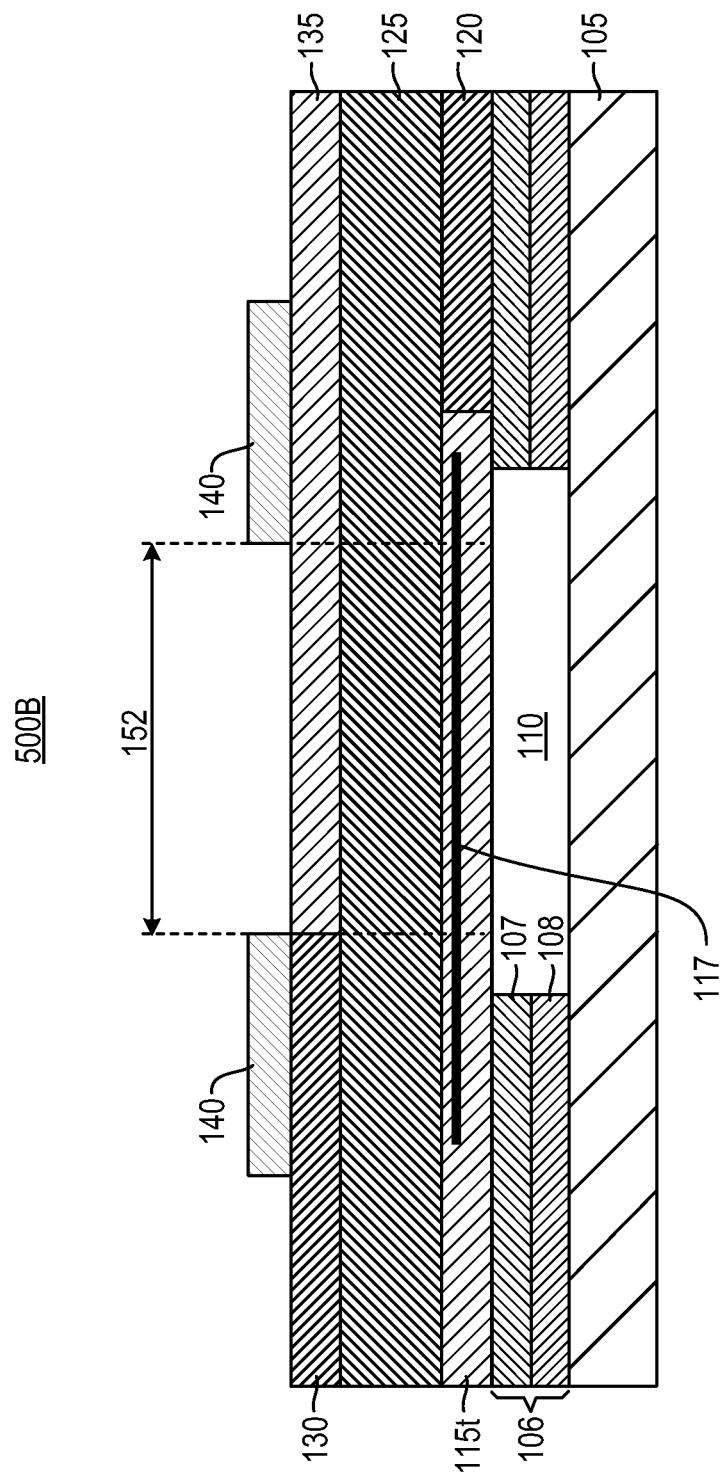
FIG. 5B is a cross-sectional view of an acoustic resonator, excluding collars, according to another representative embodiment.

Referring to FIG. 5A, the acoustic resonator 500A is a representative FBAR that is similar to acoustic resonator 200A, except that it includes only the frame 145 in addition to the perimeter DBR 106 and the temperature compensating layer 117 (with no collar). Similarly, referring to FIG. 5B, the acoustic resonator 500B is a representative FBAR that is similar to acoustic resonator 200B, except that it includes only the collar 140 in addition to the perimeter DBR 106 and the temperature compensating layer 117 (with no frame). Of course, these are only examples of features. Other features and other combinations of features may be incorporated without departing from the scope of the present teachings. For example, the acoustic resonators 500A and 500B alternative may include temperature compensating layer 127 in the piezoelectric layer 125 and/or temperature compensating layer 137 in the top electrode 135, instead of (or in addition to) the temperature compensating layer 117. Also, various different arrangements and/or types of frames (e.g., frames 145, 150, 150', 245, 250, 250') (composite or add-on) and collars (e.g., collars 140, 240, 340), as discussed above, may be incorporated, without departing from the scope of the present teachings. The perimeter DBRs, the temperature compensating features, the frames, and the collars provide benefits similar to those discussed above, although performance and manufacture varies somewhat due to different locations and combinations.

Figure 6:
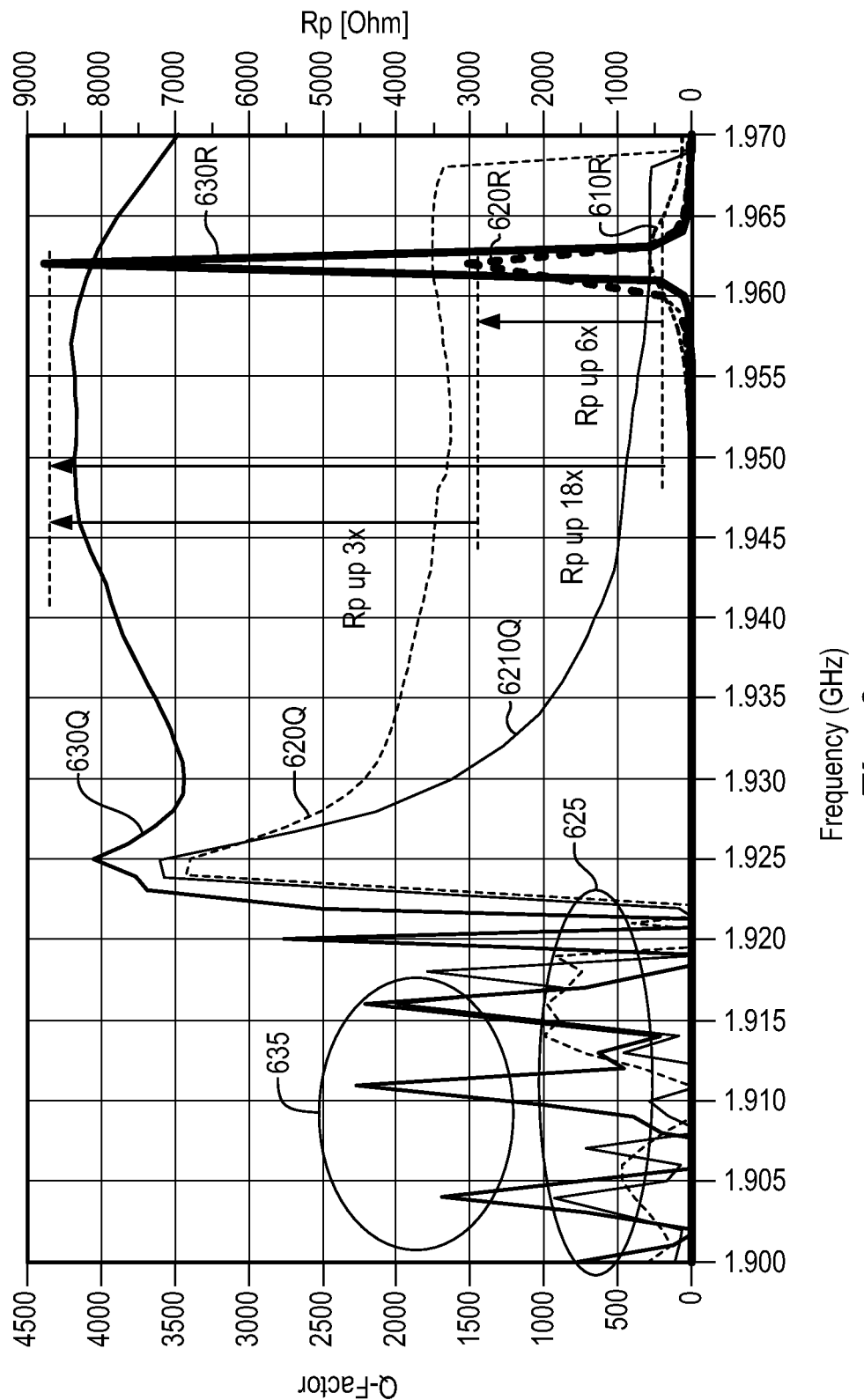
FIG. 6 is a graph illustrating the quality factor (Q-factor) and parallel resistance Rp of the acoustic resonators of FIGS. 5B and 2A, as compared to an acoustic resonator having only a temperature compensating layer.

FIG. 6 is a graph illustrating the quality factor (Q-factor) and parallel resistance Rp of the acoustic resonators of FIGS. 5B and 2A, as compared to an acoustic resonator having only a temperature compensating layer. That is, FIG. 6 illustrates simulated Q-factor and parallel resistance Rp comparisons of acoustic resonators with a temperature compensating layer (e.g., temperature compensating layer 117), with and without a perimeter DBR and collar (e.g., perimeter DBR 106 and collar 140), and with and without an integrated frame (e.g., frame 145), as are shown in FIGS. 5B and 2A, for example. The purpose of theses graphs is to illustrate changes in performance of the pass-band of the acoustic resonators that occur as a consequence of adding the perimeter DBR 106, the collar 140 and the frame 145. Referring to FIG. 6, Q-factor is represented by a y-axis on the left side, and Rp is represented by a y-axis on the right side. The values of the Q-factor and Rp are shown as functions of input signal frequencies on an x-axis.

In the example of FIG. 6, the dimensions of the acoustic resonator (e.g., acoustic resonator 200A) have been tuned for high Rp. In particular, bottom electrode 115' is formed of Mo with a thickness of approximately 3000 Å, piezoelectric layer 125 is formed of AlN with a thickness of approximately 9300 Å, top electrode 135 is formed of Mo with a thickness of approximately 3250 Å, and a passivation layer is formed (over the top electrode 135) of AlN with a thickness of approximately 2000 Å. In the example, temperature compensating layer 117 is formed of $SiO_x$ in the bottom electrode 115' with a thickness of approximately 500 Å. With regard to alignments, an outer edge of the bottom electrode 115' extends approximately 5.5 µm outside the cavity 110, an outer edge of the top electrode 135 extends approximately 5.0 µm within the cavity 110, and an outer edge of the temperature compensating layer 117 extends approximately 4 µm outside the cavity 110.

Further, in the example, the perimeter DBR 106 includes first acoustic impedance layer 107 formed of PECVD SiC with a thickness of approximately 8000 Å, and second acoustic impedance layer 108 formed of W with a thickness of approximately 5300 Å, optimized for best parallel resistance Rp for the particular scenarios, discussed below. Thus, the first acoustic impedance layer 107 may operate at a series resonance frequency of about 2.0 GHz and the second acoustic impedance layer 108 may operate at a series resonance frequency of about 2.5 GHz. With regard to collars and frames (when included), the collar 140 is formed of SiC at a thickness of approximately 9750 Å (i.e., about 4500 Å thicker than the top electrode 135 and the passivation layer) and a width of approximately 11.5 µm, and the frame 145 is a composite frame formed of approximately 350 Å thick and approximately 3.75 µm wide Al embedded in the Mo at the bottom of the top electrode 135.

FIG. 6 depicts three configurations, each of which is indicated by a corresponding Q-factor curve and Rp value curve. In particular, curves 610Q and 610R respectively illustrate the Q-factors and the Rp values of a bare resonator (FBAR) with the temperature compensating layer 117. This design generally corresponds to acoustic resonator 500B shown in FIG. 5B, but without the perimeter DBR 106 and the collar 140 (where the cavity 110 formed entirely in the substrate 105). Similarly, curves 620Q and 620R respectively illustrate the Q-factors and the Rp values of the acoustic resonator with the temperature compensating layer 117, as well as the perimeter DBR 106 and the collar 140

(e.g., acoustic resonator 500B), and curves 630Q and 630R respectively illustrate the Q-factors and the Rp values of the acoustic resonator with the temperature compensating layer 117, as well as the perimeter DBR 106, the collar 140, and the frame 145 (acoustic resonator 200A). More specifically, curves 610R, 620R and 630R illustrate magnitudes of complex-valued electrical impedance of the acoustic resonator.

At parallel resonance frequency Fp electrical impedance becomes approximately real-valued and the peak value of electrical impedance magnitude indicates parallel resistance Rp. A peak value of the Q-factor occurs for each of the curves 610Q through 630Q at about 1.925 GHz. This frequency corresponds to the series resonance frequency Fs of the respective acoustic resonators. Similarly, peak values of Rp occur for each of the curves 610R through 630R in a range of about 1.960 GHz to about 1.965 GHz. These frequencies correspond to the parallel resonance frequency Fp of the respective acoustic resonators. The bandwidths of these acoustic resonators correspond to the range of frequencies between their respective values of series resonance frequency Fs and parallel resonance frequency Fp.

Referring to FIG. 6, it is apparent that adding the combination of features (perimeter DBR 106, collar 140 and frame 145) to the acoustic resonator with temperature compensating features (temperature compensating layer 117) improves performance of the acoustic resonator. For example, adding the perimeter DBR 106 and the collar 140 (curves 620Q and 620R) increases parallel resistance Rp by about six times. Further adding the frame 145 (curves 630Q and 630R) increases the parallel resistance Rp about another three times (about an 18 times increase in parallel resistance Rp overall). In particular, curve 610R (temperature compensating layer 117 only) indicates an Rp value of about 500 Ohms, curve 620R indicates an Rp value of about 3000 Ohms and curve 630R indicates an Rp value of about 8900 Ohms. Also, at frequencies above the series resonance frequency Fs, the acoustic resonator has significantly higher Q-factor, indicated by curves 620Q and 630Q in comparison to curve 610Q. As should be appreciated by one of ordinary skill in the art, the Q-factor and Rp values of the acoustic resonator increase without significant degradation of the bandwidth when compared to the acoustic resonator with only temperature compensating layer 117.

Notably, by adding the perimeter DBR 106, the collar 140 and the frame 145, radiative loss is substantially eliminated, essentially flattening the Q-factor values at and above the series resonance frequency Fs, as indicated by curve 630Q. Increased series Q-factor Qs (decreased series resistance Rs) is due to lowered scattering at the series resonance frequency Fs. However, for frequencies below the series resonance frequency Fs, the Q-factor curve 610Q for a bare resonator with a temperature compensating layer becomes very irregular with distinct peaks and valleys between neighboring frequencies. This irregular spectral pattern, or so-called "rattles," is caused by excitation of a propagating thickness extensional mode pTE1, e.g., at the edge of the top electrode 135 for driving frequencies below series resonance frequency Fs (by analogous mechanism described above in relation to excitation of eTE1 mode for driving frequencies above the series resonance frequency Fs). As should be appreciated by one skilled in the art, for so-called type-II acoustic stacks (as considered in the present teaching), the evanescent eTE1 mode above series resonance frequency Fs corresponds to propagating pTE1-mode below series resonance frequency Fs. A phase of acoustically excited pTE1-mode may change very rapidly as the driving frequency changes, which in turn may produce a rattle in the Q-factor spectrum, as seen in curve 610Q, for example. The presence of the collar 140 in acoustic resonator 500B allows the piston mode in the main membrane region to couple predominantly to eTE1 mode in the collar region of the collar 140 rather than to pTE1-mode of main membrane region, provided that the designed collar's cutoff frequency is slightly below the driving frequency. As a result, rattles below series resonance frequency Fs are suppressed, as indicated by circle 625 for curve 620Q. Such simultaneous suppression of rattles below series resonance frequency Fs and increase of Q-factor above series resonance frequency Fs is generally very beneficial for filter performance, for example. As mentioned above, addition of a low velocity composite frame 145 in the acoustic resonator 200A, for example, enables an increase in parallel resistance Rp by approximately three times as compared to the acoustic resonator 500B without the frame. The increase of parallel resistance Rp is however accompanied by increased rattles in the acoustic resonator 200A at frequencies below the series resonance frequency Fs, as indicated by circle 635 for curve 630Q. The increase of rattles' amplitude is caused by the fact that in the low velocity frame region of the frame 145, the piston mode is driven in opposite phase to the piston mode in the main membrane region 152, causing enhanced pTE1-mode excitation at the main region/frame region interface. Thus, numerical and experimental optimization of the respective widths and thicknesses of the frame 145 and collar 140 may be performed to simultaneously decrease rattles below series resonance frequency Fs and increase Q-factor and parallel resistance Rp above resonance frequency Fs to the desired level.

In the above-described embodiments, temperature compensating features, perimeter DBRs, collars and frames can generally be formed using conventional processing techniques, with examples including various forms of deposition, sputtering, etching, polishing, and so on. Moreover, the described embodiments and related methods of fabrication can be modified in various ways as will be apparent to those skilled in the art.

In accordance with various embodiments, a temperature compensating feature and a perimeter DBR combined with one or more frames and/or collars create weakly confined structures that minimize parasitic scattering of electrically excited piston mode, and therefore create acoustically lossless acoustic resonator, such as an FBAR or SMR. Generally, the collar couples piston mode and eTE1 mode of the main membrane region to evanescent mode of the collar region, the perimeter DBR effectively eliminates dead-FBAR and minimizes coupling of the eTE1 mode of the collar to the resonator substrate, and the frame (e.g., composite frame) suppresses excitation of propagating modes.

While example embodiments are disclosed herein, one of ordinary skill in the art appreciates that many variations that are in accordance with the present teachings are possible and remain within the scope of the appended claims. For instance, as indicated above, the location, dimensions, and materials of a collar and/or frames can be variously altered. In addition, other features can be added and/or removed to further improve various performance characteristics of the described devices. These and other variations would become clear to one of ordinary skill in the art after inspection of the specification, drawings and claims herein. The invention therefore is not to be restricted except within the spirit and scope of the appended claims.

The invention claimed is:

1. An acoustic resonator, comprising:
a perimeter acoustic reflector disposed on a substrate around a perimeter of a cavity, the perimeter acoustic reflector comprising a layer of low acoustic impedance material stacked on a layer of high acoustic impedance material;
a bottom electrode disposed over the cavity and on at least a portion of the perimeter acoustic reflector;
a piezoelectric layer disposed on the bottom electrode;
a top electrode disposed on the piezoelectric layer; and
a temperature compensating feature having a positive temperature coefficient for offsetting at least a portion of a negative temperature coefficient of the piezoelectric layer, the bottom electrode and the top electrode,
wherein the cavity extends from the bottom electrode at least partially through the perimeter acoustic reflector, and ends within the perimeter acoustic reflector, at a top surface of the substrate or within the substrate, enabling vibration of at least a portion of the piezoelectric layer positioned over the cavity.

2. The acoustic resonator of claim 1, wherein the temperature compensating feature comprises a temperature compensating layer formed in at least one of the bottom electrode and the top electrode.

3. The acoustic resonator of claim 2, further comprising:
at least one frame disposed within a main membrane region defined by an overlap between the bottom electrode, the piezoelectric layer, and the top electrode, and having an outer edge substantially aligned with a boundary of the main membrane region; and
a collar formed separate from the frame, disposed outside the main membrane region, and having an inner edge substantially aligned with the boundary of or overlapping the main membrane region.

4. The acoustic resonator of claim 3, wherein the at least one frame comprises a frame disposed at a bottom portion of the top electrode, and the temperature compensating layer is formed in the bottom electrode.

5. The acoustic resonator of claim 4, wherein the at least one frame comprises another frame disposed at one of a top portion or a bottom portion of the bottom electrode.

6. The acoustic resonator of claim 3, wherein the at least one frame comprises a frame disposed at a bottom portion of the bottom electrode, and the temperature compensating layer is formed in the top electrode.

7. The acoustic resonator of claim 4, wherein the collar is formed between the perimeter acoustic reflector and the bottom electrode.

8. The acoustic resonator of claim 6, wherein the collar is formed between the perimeter acoustic reflector and the bottom electrode.

9. The acoustic resonator of claim 5, wherein the collar is formed between the perimeter acoustic reflector and the bottom electrode.

10. The acoustic resonator of claim 1, wherein the temperature compensating feature comprises a temperature compensating layer formed in the piezoelectric layer.

11. The acoustic resonator of claim 10, further comprising:
at least one frame disposed within a main membrane region defined by an overlap between the bottom electrode, the piezoelectric layer, and the top electrode, and having an outer edge substantially aligned with a boundary of the main membrane region; and
a collar formed separate from the frame, disposed outside the main membrane region, and having an inner edge substantially aligned with the boundary of or overlapping the main membrane region.

12. The acoustic resonator of claim 11, wherein the at least one frame comprises a first frame disposed in the bottom electrode and a second frame disposed in the top electrode.

13. The acoustic resonator of claim 11, wherein the collar is formed on a top surface of the top electrode and a planarization layer adjacent to the top electrode.

14. The acoustic resonator of claim 11, wherein the collar is formed between the bottom electrode and the piezoelectric layer.

15. The acoustic resonator of claim 11, wherein the collar is formed between the perimeter acoustic reflector and the bottom electrode.

16. The acoustic resonator of claim 3, wherein the at least one frame is an add-on frame or a composite frame.

17. The acoustic resonator of claim 16, wherein the collar comprises borosilicate glass, carbon-doped silicon oxide, silicon carbide, silicon nitride, aluminum oxide, aluminum nitride, zinc oxide, lead zirconium titanate, diamond or diamond-like carbon, and
wherein the frame comprises a layer of copper, molybdenum, aluminum, tungsten, iridium, borosilicate glass, carbon-doped silicon oxide, silicon carbide, silicon nitride, aluminum oxide, aluminum nitride, zinc oxide, lead zirconium titanate, diamond or diamond-like carbon.

18. The acoustic resonator of claim 1, wherein the piezoelectric layer is doped with at least one rare earth element for offsetting at least a portion of degradation of an electromechanical coupling coefficient of the acoustic resonator caused by the temperature compensating feature.

19. The acoustic resonator of claim 3, wherein the collar defines a collar region having a cutoff frequency that is substantially the same as a cutoff frequency of the main membrane region.

20. An acoustic resonator, comprising:
an acoustic stack arranged over a cavity, the acoustic stack comprising a piezoelectric layer sandwiched between bottom and top electrode layers and having a main membrane region defined by an overlap between the bottom electrode, the piezoelectric layer, and the top electrode;
a temperature compensating layer having a positive temperature coefficient for offsetting at least a portion of a negative temperature coefficient of the piezoelectric, the bottom electrode layer and the top electrode layer, the temperature compensating layer being located in one of the bottom electrode layer, the top electrode layer, and the piezoelectric layer;
a perimeter distributed Bragg reflector (DBR) disposed on a substrate around a perimeter of the cavity, the perimeter DBR consisting of a layer of low acoustic impedance material stacked on a layer of high acoustic impedance material; and
a collar disposed outside the main membrane region and having an inner edge substantially aligned with the boundary of or overlapping the main membrane region;
wherein the cavity extends from the acoustic stack through at least a portion of the perimeter DBR, ending within the perimeter DBR, at a top surface of the substrate or within the substrate.

* * * * *